United States Patent [19]

Ishikawa et al.

[11] Patent Number: 5,770,989

[45] Date of Patent: Jun. 23, 1998

[54] NONRADIATIVE DIELECTRIC LINE APPARATUS AND INSTRUMENT FOR MEASURING CHARACTERISTICS OF A CIRCUIT BOARD

[75] Inventors: Yohei Ishikawa; Toru Tanizaki, both of Kyoto; Hiroshi Nishida, Kawanishi; Sadao Yamashita, Kyoto; Atsushi Saitoh, Nagaokakyo, all of Japan

[73] Assignee: Murata Manufacturing Co., Ltd., Japan

[21] Appl. No.: 674,799

[22] Filed: Jul. 3, 1996

[30] Foreign Application Priority Data

Jul. 5, 1995 [JP] Japan ..................................... 7-169949

[51] Int. Cl.$^6$ ............................... H01P 3/16; H01P 1/22; H03B 7/14; G01R 31/02
[52] U.S. Cl. ..................... 333/248; 333/22 R; 333/81 R; 333/113; 331/107 DP; 324/537
[58] Field of Search ............................... 333/22 R, 81 B, 333/113, 239, 248, 250, 254; 331/96, 107 DP

[56] References Cited

U.S. PATENT DOCUMENTS

| 4,463,330 | 7/1984 | Yoneyama ........................... 333/248 X |
| 5,394,154 | 2/1995 | Uematsu et al. ....................... 331/96 X |
| 5,473,296 | 12/1995 | Ishikawa et al. ..................... 333/248 X |
| 5,604,469 | 2/1997 | Ishikawa et al. ..................... 333/254 X |

OTHER PUBLICATIONS

Yoneyama, Tsukasa "Millimeter–Wave Integrated Circuits Using Nonradiative Dielectric Waveguide", *Electronics and Communications in Japan,* Part II:Electronics 74 (1991) Feb. No. 2, New York, NY pp. 20–28.

Takada, Maysayuki and Tsukasa Yoneyama, "Self–Injection Locked Gunn Oscillator Using Nonradiative Dielectric Waveguide", *Electronics and Communications in Japan,* Part II:Electronics, vol. 72, No. 11, Nov. 1989, New York, NY, pp. 95–100.

*Primary Examiner*—Robert Pascal
*Assistant Examiner*—Barbara Summons
*Attorney, Agent, or Firm*—Ostrolenk, Faber, Gerb & Soffen, LLP

[57] ABSTRACT

The ease of mounting a circuit board on a nonradiative dielectric line is improved, the degree of freedom of conductor film patterns formed on the circuit board is increased, and the degree of integration can be easily increased to fit within a small size. Dielectric strips are provided between the two conductor plates positioned in parallel to each other, and a circuit board is positioned parallel to the conductor plates. The conductor patterns on the circuit board and the transmission waves of the nonradiative dielectric line are electromagnetically coupled to each other.

5 Claims, 26 Drawing Sheets

NONRADIATIVE DIELECTRIC LINE APPARATUS AND INSTRUMENT FOR MEASURING CHARACTERISTICS OF A CIRCUIT BOARD

BACKGROUND OF THE INVENTION

1. Field of the Invention

The present invention relates to an apparatus employing a nonradiative dielectric line and, more particularly, to an apparatus suitable for an integrated circuit for use in a millimetric-wave band or a microwave band.

2. Description of the Related Art

FIGS. 26(A), 26(B) and 26(C) are sectional views illustrating the constructions of three types of a conventional nonradiative dielectric line (an NRD wave guide). FIG. 26(A) shows what is commonly called a normal-type nonradiative dielectric line in which a dielectric strip 100 is disposed between conductors 101 and 102 disposed substantially parallel to each other. FIG. 26(B) shows what is commonly called a grooved-type nonradiative dielectric line in which a groove is formed in each of the conductors 101 and 102, and the dielectric strip 100 is fitted into the grooves. FIG. 26(C) shows what is commonly called a winged-type nonradiative dielectric line comprising conductors 101 and 102 which contact plane-shaped wing portions 103' and 104' of dielectric strips 103 and 104, the dielectric strips 103 and 104 face each other across a gap.

In such a nonradiative dielectric line, transmission loss is reduced by making the spacing y between the conductors to be a half-wavelength of the propagation wavelength of the electromagnetic wave, thus suppressing radiation at a bent portion or a noncontinuous portion.

FIG. 27 shows an example of a conventional apparatus employing such a nonradiative dielectric line. Referring to FIG. 27, reference numeral 105 denotes a circuit board on which electrodes 106 and 107 are formed and a beam-lead diode 108 is mounted. With such a placement of a circuit board having electrodes formed thereon and having electronic parts mounted thereon on the end surface of the dielectric strip 100, in this example, the beam-lead diode 108 will be coupled to the electromagnetic wave which is propagated through the dielectric strip 100.

FIG. 28 shows an example in which a nonradiative dielectric line is applied to a Gunn oscillator. Referring to FIG. 28, reference numeral 109 denotes a strip line formed on the circuit board 105. Reference numeral 110 denotes a Gunn diode incorporated into the block, with its electrodes being connected to the strip line 109. The circuit board 105, being positioned in parallel to the end surface of the dielectric strip 100 (in a direction perpendicular to a direction parallel to the length of the dielectric strip), causes the electromagnetic wave propagated through the dielectric strip 100 and the strip line 109 to be electromagnetically coupled to each other.

As described above, in the conventional apparatus employing a nonradiative dielectric line, in order to couple a dielectric strip to a conductor line on a circuit board, a circuit board is positioned on the end surface of the dielectric strip, and the circuit board is positioned perpendicular to the length of the dielectric strip. However, in such a construction, it is difficult to fixedly secure the circuit board within the apparatus, and since the circuit board is likely to be inclined, the circuit board cannot be easily mounted. Further, since in this construction which a circuit board is disposed between two conductors, only long, narrow strip-shaped circuit boards can be used, and the patterns of conductor lines or the like that can be formed are limited. For this reason, it is not possible to form an integrated circuit of a relatively large-scale circuit with a small number of parts.

Further, with the dielectric strip being disposed between the conductors and an integrated circuit is formed together with the circuit board, adjustments cannot be performed with a single circuit board. Therefore, adjustment operations must be repeatedly performed. For example, characteristics are measured with the circuit board incorporated into the nonradiative dielectric line, the circuit board is removed during the adjustment, and the circuit board is assembled again after the adjustment and its characteristics are again measured. Thus, the adjustment operations are complicated and inefficient.

SUMMARY OF THE INVENTION

It is an object of the present invention to provide a nonradiative dielectric line apparatus in which the ease of mounting of the circuit board in the nonradiative dielectric line apparatus is improved, the degree of freedom of conductor film patterns to be formed on the circuit board is increased, and the degree of integration can be easily increased to fit within a small size.

It is another object of the present invention to provide an instrument for measuring characteristics of a circuit board, in which instrument characteristic measurement and adjustments are made possible with a single circuit board.

In the nonradiative dielectric line apparatus according to one aspect of the present invention, in order to improve the ease of mounting of a circuit board in a nonradiative dielectric line, to increase the degree of freedom of patterns of a conductor film to be formed on the circuit board, and to increase the degree of integration within a small size, a circuit board having a conductor film or a circuit element together with a conductor film provided thereon is disposed between two conductors and substantially parallel to the conductors, and the conductor film or the circuit element provided on the circuit board is brought close to or is made to penetrate into the dielectric strip in order to couple the conductor film or the circuit element to the nonradiative dielectric line. With this construction, the conductor film or the circuit element on the circuit board is coupled to the electromagnetic wave which is propagated through the dielectric strip, and thus a nonradiative dielectric line apparatus serving as an integrated circuit into which a nonradiative dielectric line and a circuit board are incorporated can be obtained. At this point, since the circuit board is disposed between two conductors to be substantially parallel to the two conductors, the ease of mounting of the circuit board is high because, for example, when two conductors are disposed in parallel to each other, the circuit board is positioned so as to be interposed between the conductors or positioned along the conductors. Further, since the circuit board is positioned along the two conductors, it is possible to provide a number of conductor films or circuit elements together with the conductor films by using a large-area circuit board, and thus an apparatus having a high integration can be easily obtained.

In the nonradiative dielectric line apparatus according to another aspect of the present invention, in order for the nonradiative dielectric line apparatus to be used as an oscillator, an oscillation element, and a conductor line for transmitting oscillation signals of the oscillation element are provided on the circuit board, and the conductor line is brought close to or is made to penetrate into the dielectric strip in order to transmit the oscillation signals to the nonradiative dielectric line. With this construction, the oscillation signals of the oscillation element are transmitted to the nonradiative dielectric line, and thus a nonradiative dielectric line apparatus serving as an integrated circuit into which an oscillator together with a nonradiative dielectric line are incorporated can be obtained.

In the nonradiative dielectric line apparatus according to a further aspect of the present invention, in order for the nonradiative dielectric line apparatus to be used as an attenuator or terminator, a resistor film is formed on the circuit board, and the resistor film is brought close to or is made to penetrate into the dielectric strip in order to attenuate the electromagnetic wave to be propagated through the nonradiative dielectric line. With this construction, since the energy of the electromagnetic wave of a mode having electric-field components parallel to the resistor film, namely, an LSM mode, is converted into Joule heat in the resistor film, the electromagnetic wave which is propagated through the nonradiative dielectric line is attenuated, and thus a nonradiative dielectric line apparatus serving as an integrated circuit in which an attenuator or a terminator is incorporated together with a nonradiative dielectric line can be obtained.

In the nonradiative dielectric line apparatus according to a still further aspect of the present invention, in order for the nonradiative dielectric line apparatus to be used as a directional coupler, two of the dielectric strips are provided side by side to form two nonradiative dielectric lines, a plurality of conductor film patterns are provided on the circuit board at intervals of ¼ waveguide length, the plurality of conductor film patterns provided between the two dielectric strips, and the plurality of conductor film patterns are brought close to or are made to penetrate into the two dielectric strips in order to couple the two nonradiative dielectric lines. With this construction, since two dielectric strips are disposed between two conductors, two nonradiative dielectric lines are formed, and the two nonradiative dielectric lines are coupled to each other via a plurality of conductor film patterns. For example, in a case in which three strip lines a, b and c are provided for two dielectric strips as shown in FIG. 14, the waves which enter from (1) exit in part to (2), and a remaining part of the waves leak to a dielectric strip on the right through the three strip lines a, b and c. At this time, since all waves which exit to (4) and which pass through any strip line are out of phase by the same phase, the waves are synthesized at the same phase. However, regarding the waves which exit to (3), the waves which pass through the rear strip line (e.g., a strip line b) are delayed in comparison with the waves which pass through the front strip line (e.g., a strip line a) by a phase corresponding to $\lambda/4+\lambda.g/4=\lambda.g/2$. Therefore, the synthesized waves cancel each other, and no wave appears in the direction of (3). As a result, the nonradiative dielectric line apparatus works as a directional coupler.

In an instrument for measuring characteristics of a circuit board according to a still further aspect of the present invention, in order for the instrument to be able to measure the characteristics of a circuit board, there are provided two conductors positioned in parallel to each other, a dielectric strip disposed between the two conductors, and a circuit board housing section for housing the circuit board according to the above-mentioned aspects of the invention, which circuit board housing section is disposed between the two conductors, wherein the characteristics of the circuit board are measured via the dielectric strip with the circuit board being housed in the circuit board housing section. With this construction, by housing a circuit board set forth in any one of the above-mentioned aspects of the invention in the circuit board housing section provided between two conductors positioned parallel to each other, a nonradiative dielectric line apparatus comprising a circuit board is formed. Therefore, it is possible to measure the characteristics of the circuit board by measuring the electromagnetic waves propagated through the dielectric strip via the dielectric strip. Further, after the fact is confirmed that predetermined characteristics can be obtained, or after the adjustments of the circuit board are performed until predetermined characteristics are obtained, a nonradiative dielectric line apparatus having desired characteristics can be obtained by incorporating the circuit board into an actual nonradiative dielectric line.

The above and further objects, aspects and novel features of the invention will become more apparent from the following detailed description when read in connection with the accompanying drawings.

DESCRIPTION OF PREFERRED EMBODIMENTS

Figure 1:
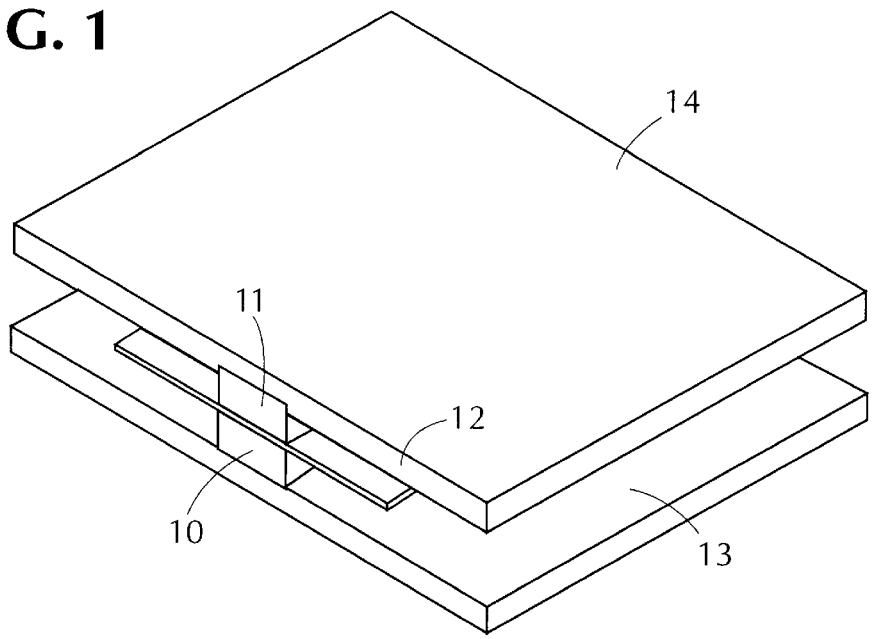
FIG. 1 is a perspective view of a nonradiative dielectric line apparatus according to a first embodiment of the present invention.
Figure 2:
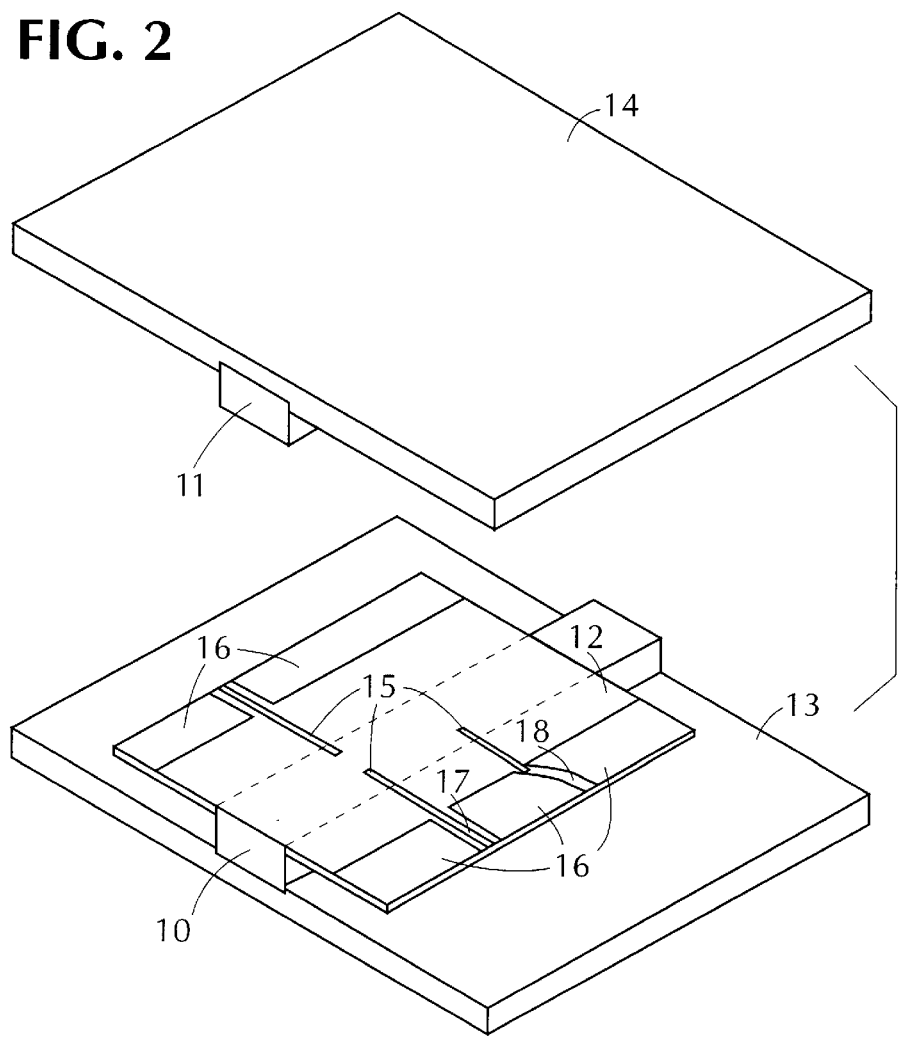
FIG. 2 is an exploded perspective view of the nonradiative dielectric line apparatus shown in FIG. 1.

The construction of a nonradiative dielectric line apparatus according to a first embodiment of the present invention is shown in FIGS. 1 and 2.

Figure 5A:
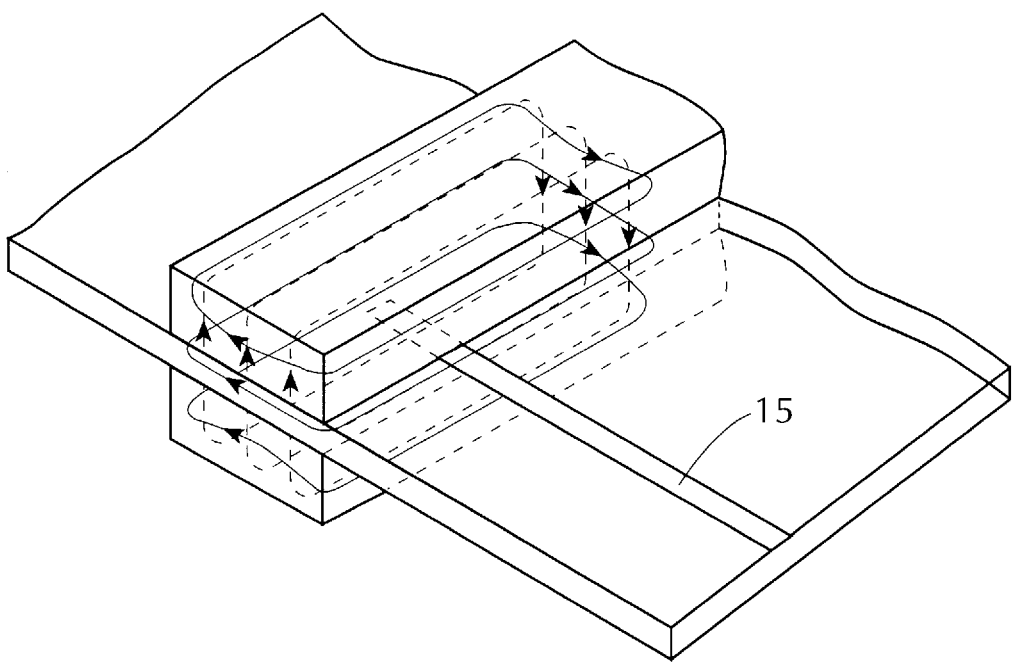
FIGS. 5(A) and 5(B) are partial perspective views illustrating the relationship between the electromagnetic-field distribution of the nonradiative dielectric line and the conductor film patterns on the circuit board.

FIG. 1 is a perspective view illustrating the construction of the main section. FIG. 2 is an exploded perspective view of the apparatus shown in FIG. 1. Referring to FIGS. 1 and 2, reference numerals 13 and 14 denote conductor plates, a groove being formed on each of the facing surfaces of the two conductor plates, with dielectric strips 10 and 11 whose cross sections are in a rectangular shape being provided on those grooves. Reference numeral 12 denotes a circuit board of, for example, a fluororesin type, with strip lines 15. To be more precise, strip-lines are formed by these conductor lines, and the conductor plates 13 and 14. Ground conductors 16 are formed on the top surface of the circuit board as shown in FIG. 2. The strip lines are used to form a coplanar guide formed of a conductor line 17 and the ground conductor 16, and to form a planar dielectric line in the portion shown at reference numeral 18 by means of the circuit board, which is a dielectric, and the ground conductor 16 and the conductor plates 13 and 14. The concept of such a planar dielectric line has been disclosed in Japanese Patent Application Laid-Open No. 7-69867, and this technology can be applied to the present invention. By disposing the circuit board 12 having various conductor films formed thereon in this way between the two conductor plates 13 and 14 and in such a manner as to be interposed between the dielectric strips 10 and 11, a nonradiative dielectric line is formed by the dielectric strips 10 and 11, the circuit board 12, and the conductor plates 13 and 14. As will be described later, the spacing between the two conductor plates 13 and 14, the thickness dimension of the circuit board 12, and the dielectric constants of the dielectric strips 10 and 11 and the circuit board 12, are determined so as to utilize electromagnetic waves of the $LSM_{01}$ mode. FIG. 5(A) shows the electromagnetic-field distribution of the LSM mode in this case. However, the illustration of the upper and lower conductor plates is omitted. In FIG. 5(A), the solid lines indicate lines of electric force, and the dotted lines indicate lines of magnetic force. Although the electromagnetic-field distribution varies according to the dielectric constant of the circuit board and the dielectric constant of the dielectric strip, since basically the LSM mode is a mode in which the magnetic field is parallel to the boundary surface between the dielectric strip and air, the strip lines 15 shown in FIG. 2 and the electromagnetic wave are coupled to each other.

Figure 3:
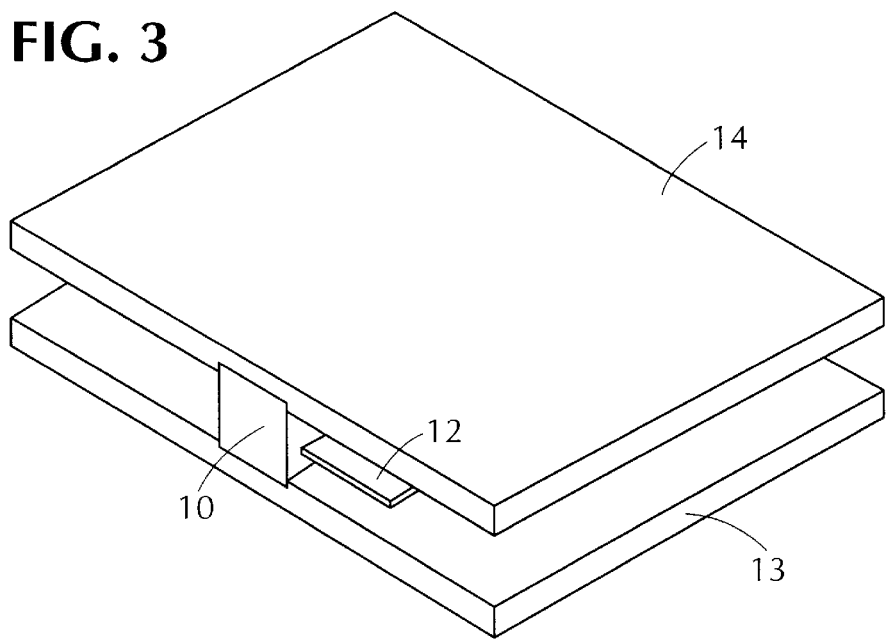
FIG. 3 is a perspective view of a nonradiative dielectric line apparatus according to a second embodiment of the present invention.
Figure 4:
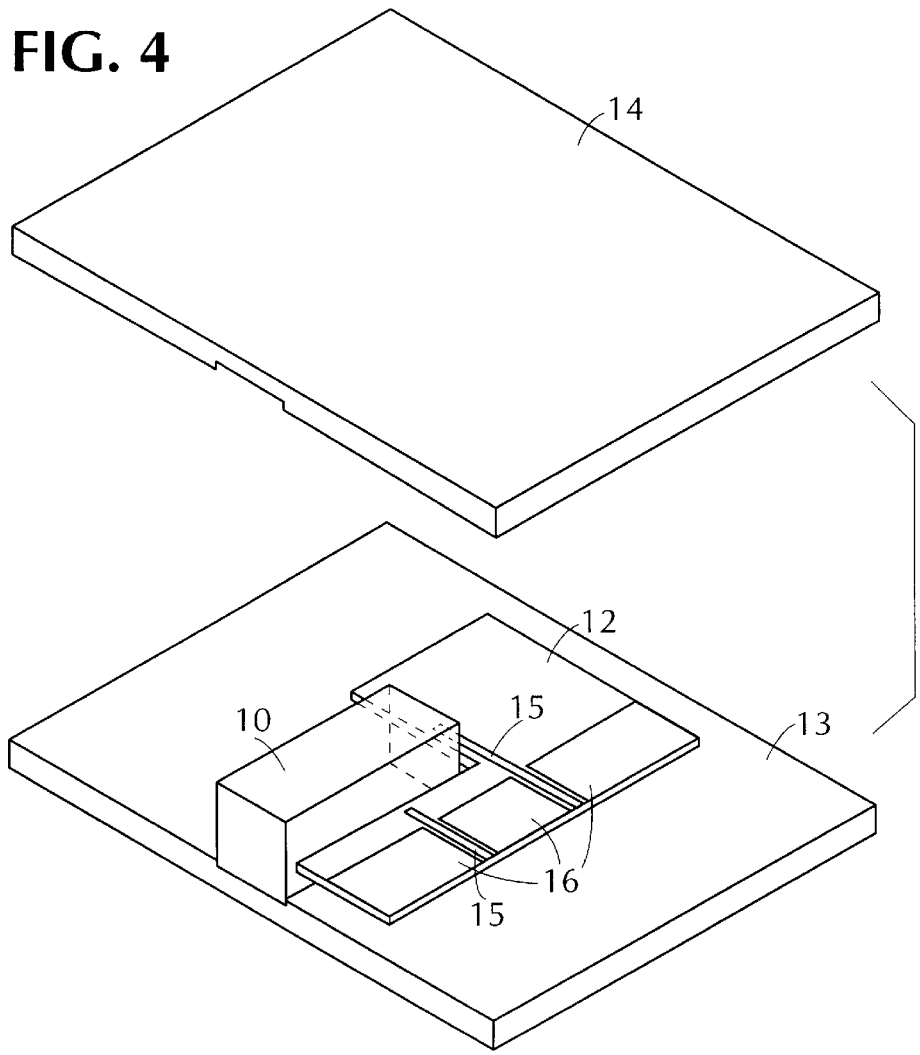
FIG. 4 is an exploded perspective view of the nonradiative dielectric line apparatus shown in FIG. 3.

Next, the construction of a nonradiative dielectric line apparatus according to a second embodiment of the present invention is shown in FIGS. 3 and 4.

Figure 5B:
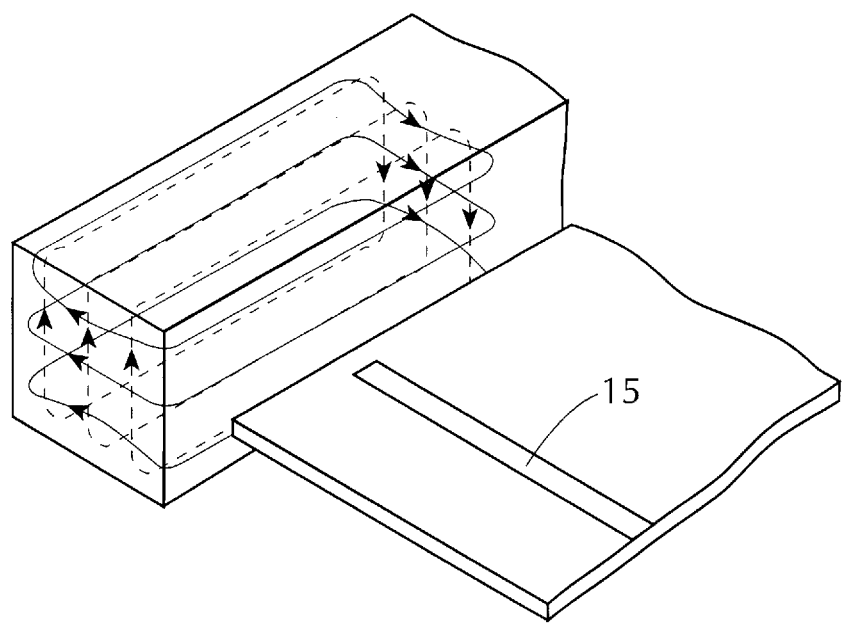

FIG. 3 is a perspective view illustrating the construction of the main section. FIG. 4 is an exploded perspective view of the apparatus shown in FIG. 3. In FIGS. 3 and 4, reference numerals 13 and 14 denote conductor plates, a groove being formed in each of the facing sides of the two conductor plates, with the dielectric strip 10 whose cross section is rectangular being fitted into those grooves. The circuit board 12 is disposed between the conductor plates 13 and 14 and parallel to the two conductor plates. For example, a projection portion (not shown) may be provided in the conductor plate 13, and the circuit board 12 secured to the projection portion by screws, with the circuit board 12 being secured in a predetermined posture at a predetermined position. The circuit board 12 has strip lines 15 similar to those in the first embodiment. FIG. 5(B) shows the electromagnetic-field distribution of the LSM mode in this case. However, also in this case, the illustration of the upper and lower conductor plates is omitted. In FIG. 5(B), the solid lines indicate lines of electric force, and the dotted lines indicate lines of magnetic force. Even if the circuit board 12 is not interposed between the two dielectric strips as described above, since the magnetic field of the $LSM_{01}$ mode leaks outside from the boundary surface between the dielectric strip 10 and the air between the conductor plates 13 and 14, the magnetic field and the strip line 15 are magnetically coupled to each other.

Figure 6A:
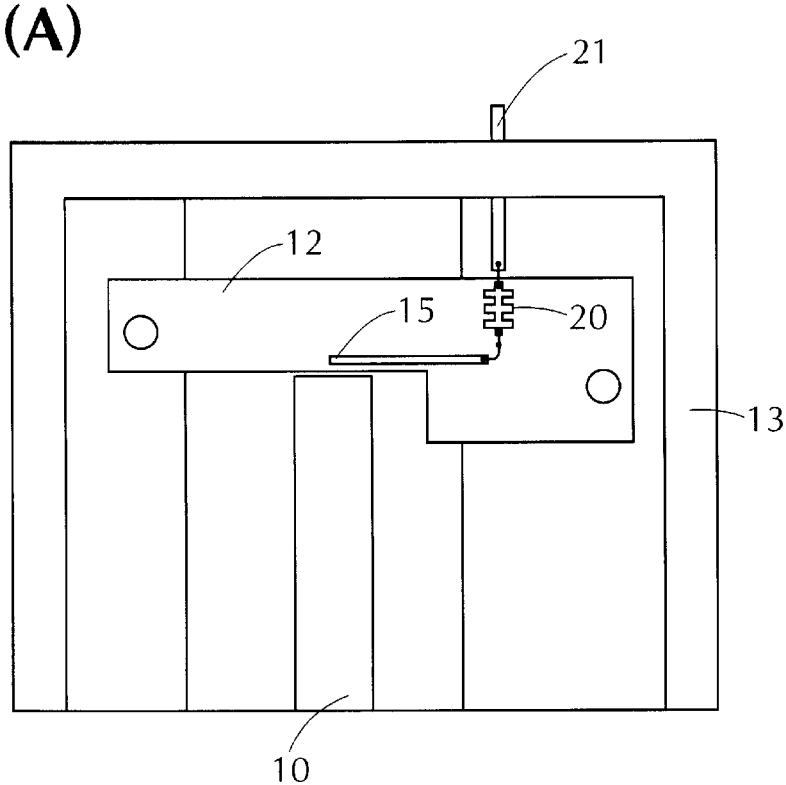
FIGS. 6(A) and 6(B) show the construction of a nonradiative dielectric line apparatus for use as an oscillator according to a third embodiment of the present invention.
Figure 6B:
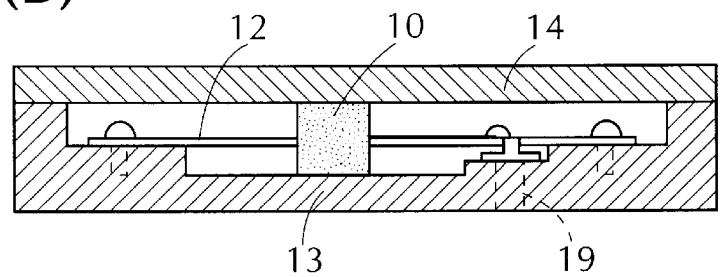

Next, the construction of a nonradiative dielectric line apparatus for use as an oscillator according to a third embodiment of the present invention is shown in FIGS. 6(A) and 6(B). FIG. 6(B) is a front view when seen from the output end side, and FIG. 6(A) is a top plan view in which an upper conductor plate is removed. In FIGS. 6(A) and 6(B), reference numerals 13 and 14 denote conductor plates which constitute the lower housing and the upper housing, respectively, with the dielectric strip 10 being mounted at a predetermined position between the housings. As a result, the dielectric strip 10, and the internal surfaces of the conductor plates 13 and 14, form a nonradiative dielectric line. Further, the circuit board 12 is secured to the conductor plate 13 by screws. Provided on the circuit board 12 are the strip line 15 and a conductor pattern 20 which forms an RF choke. A Gunn diode 19 is secured to the conductor plate 13 by screws, with its terminals being wire-bonded to the strip line 15 and the conductor pattern 20. Further, a bias terminal 21 is mounted on the conductor plate 13, and the end of the bias terminal 21 within the interior of the conductor plate 13 is lead-connected to the end portion of the conductor pattern 20. In this construction, by applying a DC bias to the Gunn diode 19, the Gunn diode 19 oscillates, its oscillation signal is propagated through the strip line 15, the strip line 15 and the above-described dielectric line are coupled to each other, and the oscillation signal will be propagated through the nonradiative dielectric line.

Figure 7:
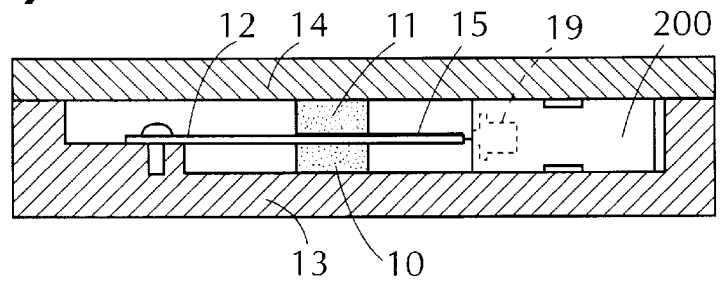
FIG. 7 shows the construction of a nonradiative dielectric line apparatus for use as an oscillator according to a fourth embodiment of the present invention.

Next, the construction of another nonradiative dielectric line apparatus for use as an oscillator according to a fourth embodiment of the present invention is shown in FIG. 7. Unlike the third embodiment, the circuit board 12 is interposed between the two dielectric strips 10 and 11. The strip line 15 is provided on the circuit board 12, and the terminals of the Gunn diode 19 provided within the block 200 are connected to the strip line 15. The strip line 15 penetrates into the interior of the facing surfaces of the two dielectric strips 10 and 11, and the nonradiative dielectric line is formed from the dielectric strips 10 and 11, the circuit board 12, and the conductor plates 13 and 14. Thus, the oscillation signal of the Gunn diode 19 is propagated to the above-described line through the strip line 15.

Figure 8A:
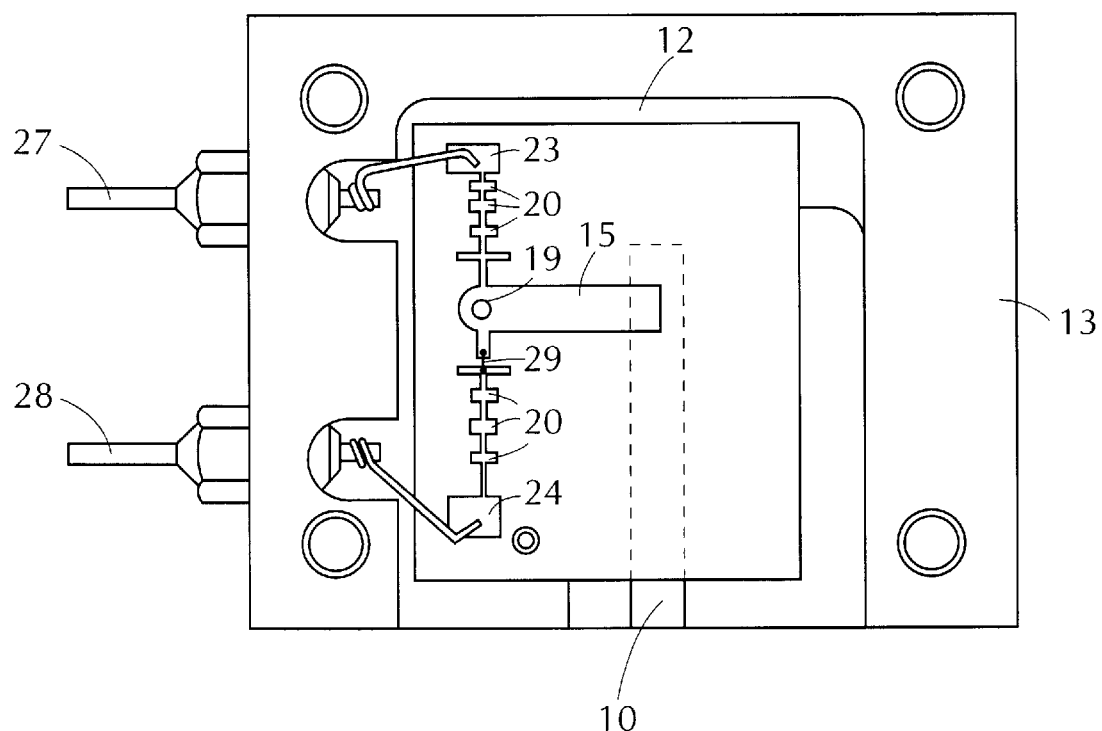
FIGS. 8(A) and 8(B) show the construction of a nonradiative dielectric line apparatus for use as an oscillator according to a fifth embodiment of the present invention.
Figure 8B:
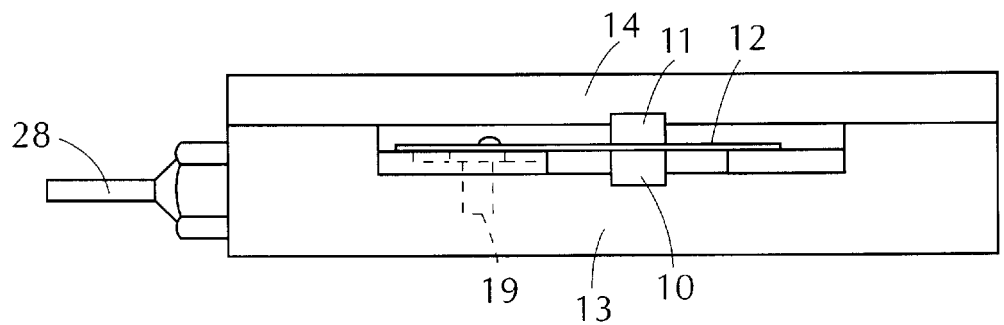

Next, the construction of a nonradiative dielectric line apparatus for use as an oscillator including a modulator according to a fifth embodiment of the present invention is shown in FIGS. 8(A) and 8(B). In FIGS. 8(A) and 8(B), FIG. 8(B) is a side view seen from the side where a modulated signal is outputted, and FIG. 8(A) is a top plan view in which the upper conductor plate is removed. In FIGS. 8(A) and 8(B), the dielectric strips 10 and 11 are provided at predetermined positions on the conductor plates 13 and 14 which act as the upper and lower housings, respectively. The circuit board 12 is secured to the conductor plate 13 by screws. Further, a DC terminal 28 for a varactor diode and a DC terminal 27 for a Gunn diode are provided on the conductor plate 13. Provided on the circuit board 12 are the strip line 15, conductor patterns 20 forming RF chokes, and electrodes 23 and 24. Further, the Gunn diode 19 is secured to the conductor plate 13 by screws, with its terminals being connected to the strip line 15 on the surface of the circuit board. Further, a varactor diode 29 is connected between the strip line 15 and one of the conductor patterns 20. Furthermore, the electrode 23 is connected by a lead to the DC terminal 27 for receiving a bias, and the electrode 24 is connected by a lead to the modulation input terminal 28. With this construction, by inputting a modulation signal between the modulation terminal 28 and the bias terminal 27 and applying a high DC voltage between the bias terminal 27 and ground, the Gunn diode oscillates, and its oscillation frequency varies according to the electrostatic capacity of the varactor diode. The oscillation signal is propagated to the nonradiative dielectric line through the strip line 15 and to the output side seen in FIG. 8(B).

Figure 9:
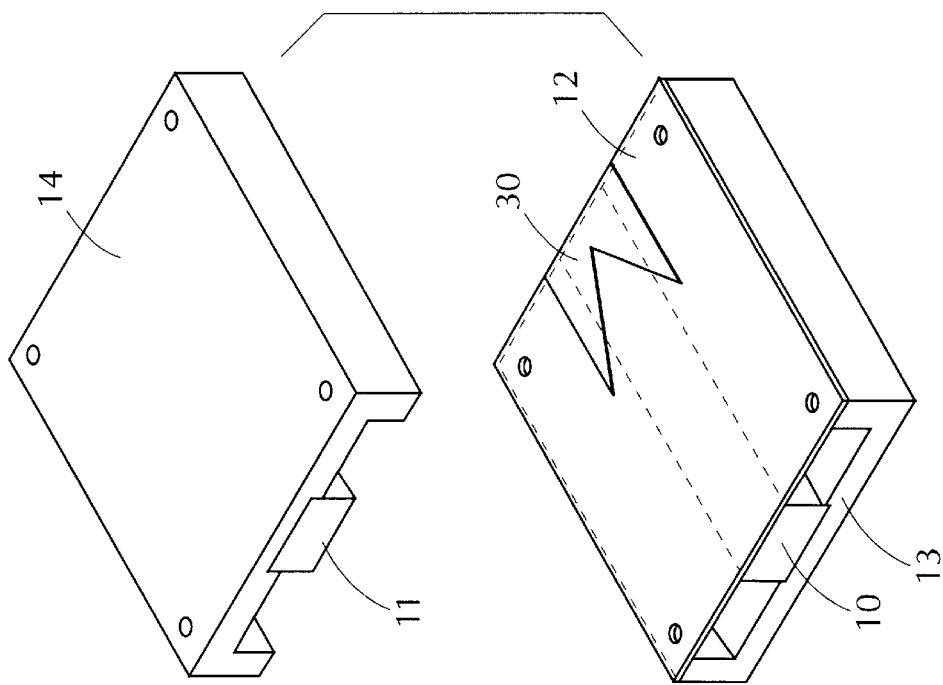
FIG. 9 shows the construction of a nonradiative dielectric line apparatus for use as a terminator according to a sixth embodiment of the present invention.

Next, the construction of a nonradiative dielectric line apparatus for use as a terminator according to a sixth embodiment of the present invention is shown in FIG. 9. FIG. 9 is an exploded perspective view illustrating a pattern provided on the circuit board 12. A resistor film 30 is formed in a tapered shape at a position where the resistor film is interposed between the dielectric strips 10 and 11 as shown in the figure. When the circuit board 12 is positioned in such a manner as to be interposed between the dielectric strips 10 and 11 and the conductor plates 13 and 14, a nonradiative dielectric line is formed. The electromagnetic waves which propagate through the line are coupled to the resistor film 30, and the energy of the electromagnetic wave is consumed by the resistor film 30, eliminating reflection in the direction of the incident end.

Figure 10:
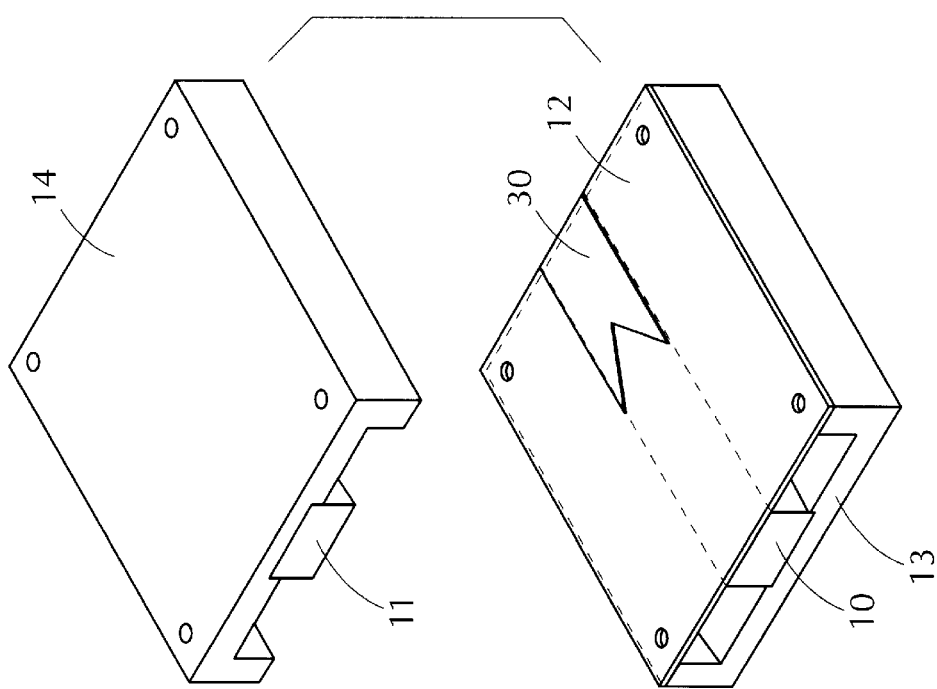
FIG. 10 shows the construction of a nonradiative dielectric line apparatus for use as a terminator according to a seventh embodiment of the present invention.

FIG. 10 is an exploded perspective view illustrating the construction of another nonradiative dielectric line apparatus for use as a terminator according to a seventh embodiment of the present invention. Unlike the embodiment shown in FIG. 9, the resistor film is formed in areas beyond the facing surfaces of the dielectric strips 10 and 11. As a result, the resistor film is coupled also with the electromagnetic wave distributed in the vicinity of the dielectric strip, and thus the electromagnetic waves can be attenuated more effectively.

Figure 11A:
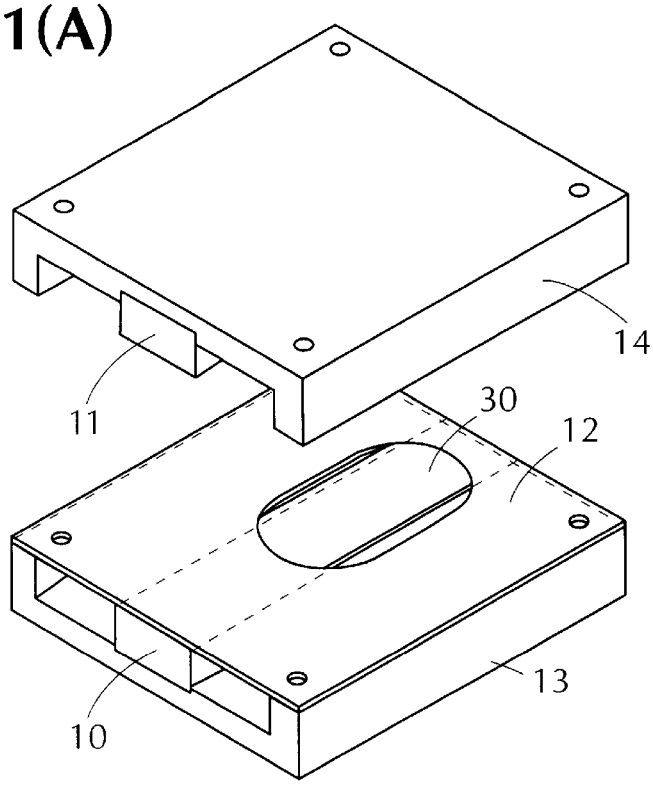
FIGS. 11(A) and 11(B) show the construction of a nonradiative dielectric line apparatus for use as a terminator according to an eighth embodiment of the present invention.
Figure 11B:
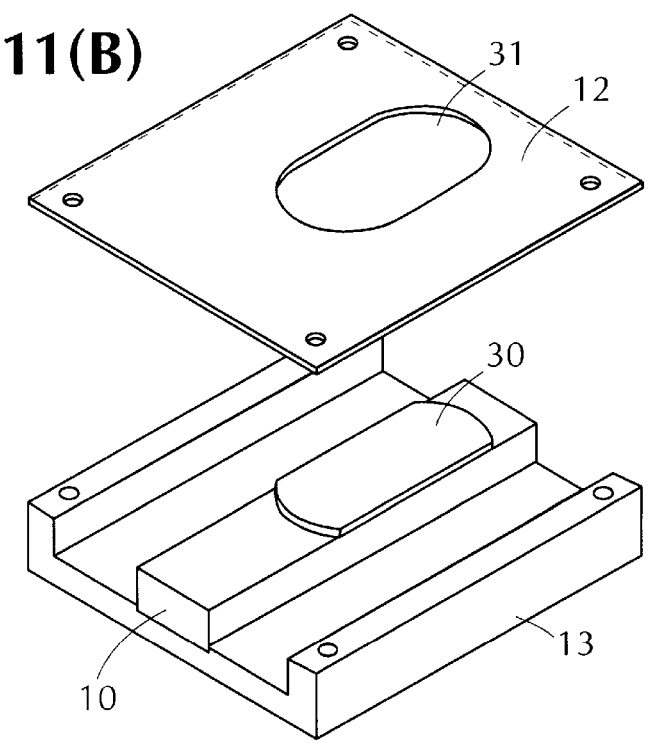

FIGS. 11(A) and 11(B) show the construction of a nonradiative dielectric line apparatus for use as a terminator according to an eighth embodiment of the present invention. FIG. 11(A) is an exploded perspective view in which a conductor plate 14 together with the upper dielectric strip 11 are separated. FIG. 1(B) is a partial exploded perspective view showing the circuit board 12 removed from the lower conductor plate 13. As shown in the figures, a resistor film 30 is formed on the upper side of the dielectric strip 10, and an opening portion 31 is formed in the circuit board 12 so as to avoid that portion where the resistor film is formed. As a result, even if the film thickness of the resistor film 30 is large, the surface of the circuit board 12 can be made substantially flat, making it possible to place the upper dielectric strip 11 on and in close contact with the circuit board 12. This resistor film 30 is formed by printing a resistor paste on the dielectric strip, or by affixing a resistor sheet in a tape shape on the dielectric strip.

Figure 12B:
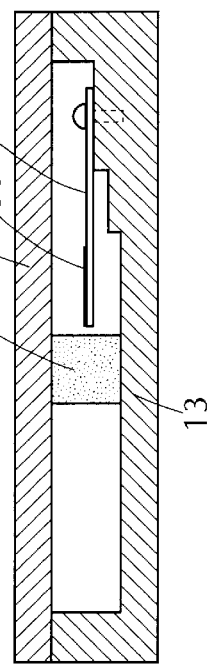
FIGS. 12(A) and 12(B) show the construction of a nonradiative dielectric line apparatus for use as an attenuator according to a ninth embodiment of the present invention.
Figure 12A:
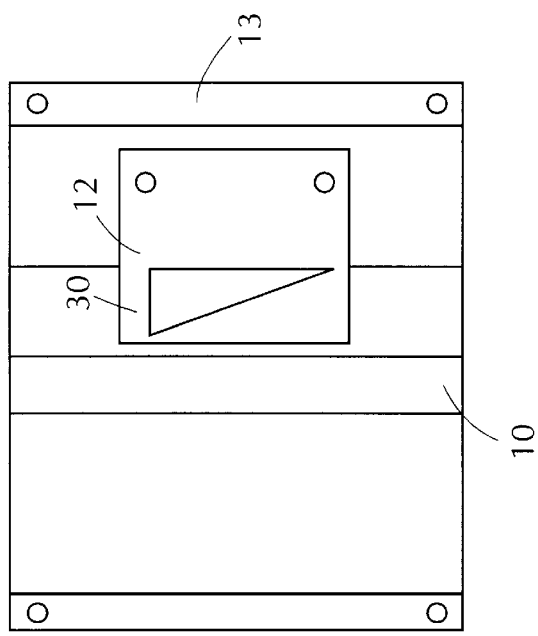

Next, the construction of a nonradiative dielectric line apparatus for use as an attenuator according to a ninth embodiment of the present invention is shown in FIGS. 12(A) and 12(B). FIG. 12(B) is a side view seen from the side where an electromagnetic wave is incident, and FIG. 12(A) is a top plan view in which the upper conductor plate 14 which constitutes the upper housing is removed. In FIGS. 12(A) and 12(B), a resistor film 30 is formed on the circuit board 12 in a tapered shape as shown in FIG. 12(A). As a result, a nonradiative dielectric line is formed by the dielectric strip 10, and the conductor plates 13 and 14. The electromagnetic waves which propagate through the line are coupled to the resistor film 30, and the energy of the electromagnetic wave is consumed gradually by the resistor film 30. As a result, this apparatus works as an attenuator.

Figure 14:
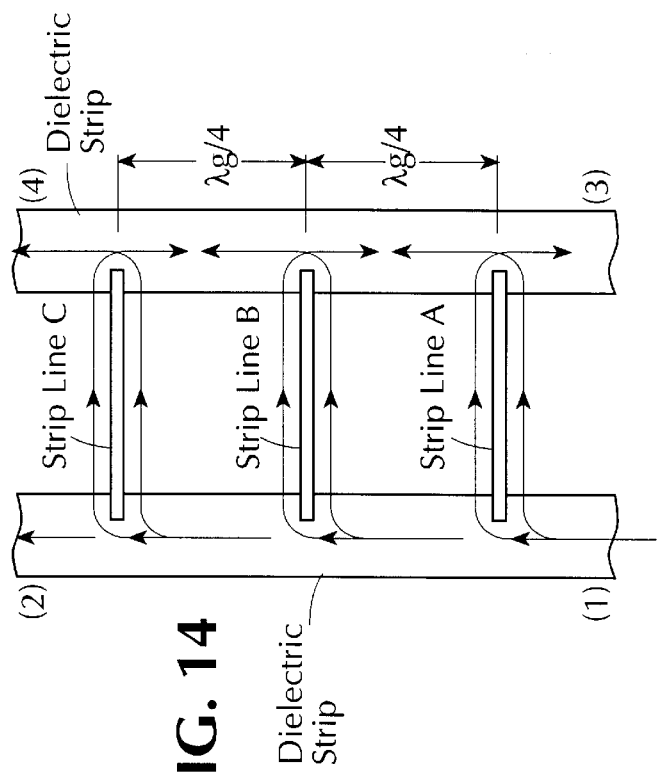
FIG. 14 shows the relationship between a dielectric strip and a strip line in the directional coupler.
Figure 13:
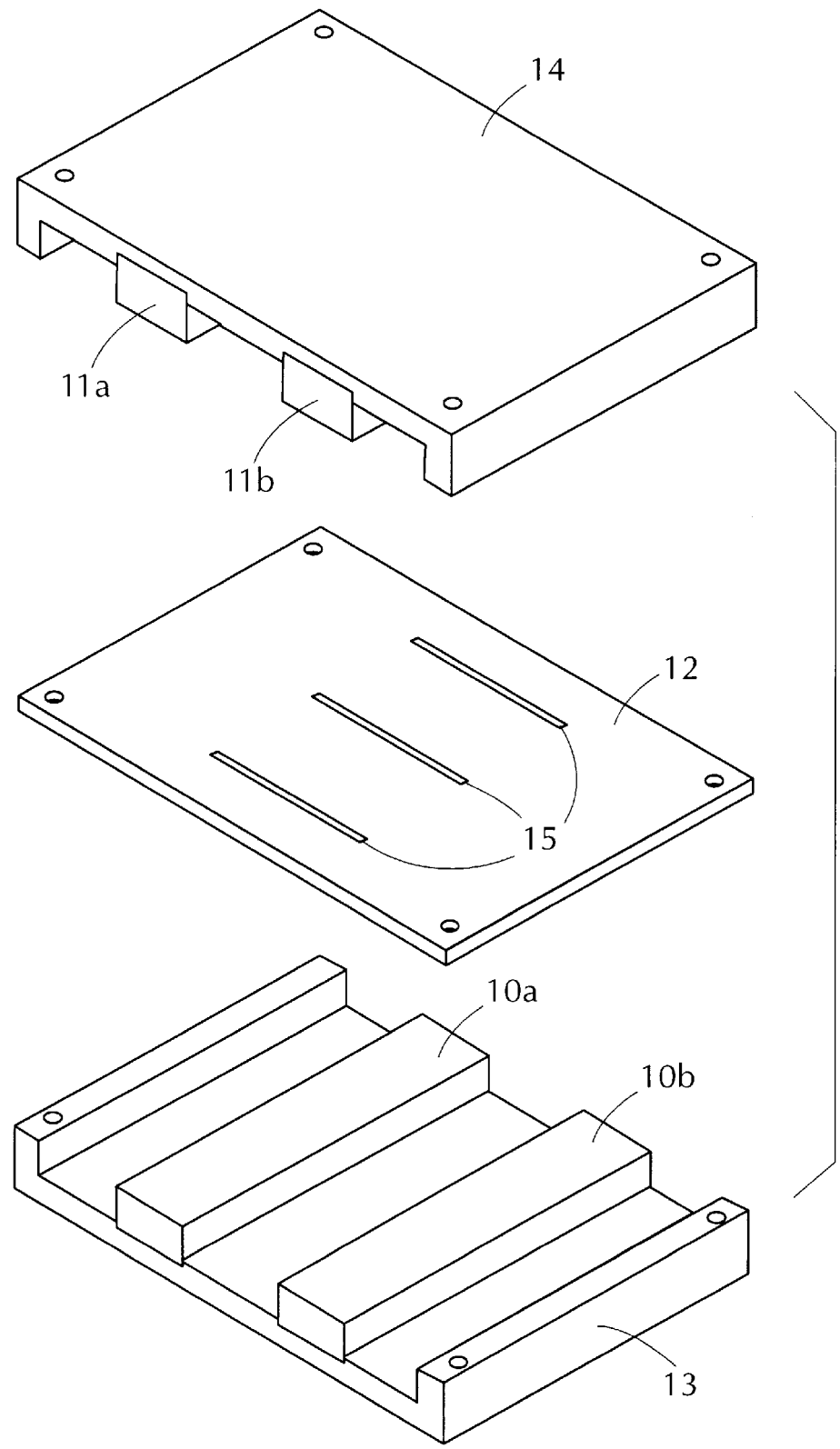
FIG. 13 shows the construction of a nonradiative dielectric line apparatus for use as a directional coupler according to a tenth embodiment of the present invention.

Next, the construction of a nonradiative dielectric line apparatus which works as a directional coupler according to a tenth embodiment of the present invention is shown in FIGS. 13 and 14. FIG. 13 is an exploded perspective view of the apparatus. Two dielectric strips 10a and 10b are provided on the upper conductor plate 13 and two dielectric strips 11a and 11b are provided on the lower conductor plate 14, with the circuit board 12 being interposed between them and assembled. The strip lines 15 are provided at intervals of ¼ waveguide length on the circuit board 12. With this circuit board 12 being interposed between the upper and lower conductor plates 13 and 14, two nonradiative dielectric lines are formed by the dielectric strips 10a, 10b, 11a, and 11b, the circuit board 12, and the conductor plates 13 and 14, and the strip lines 15 are placed in such a manner as to cross the two dielectric lines.

FIG. 14 shows the relationship between the two nonradiative dielectric lines and the strip lines. In a case in which two or more strip lines a, b and c are provided at intervals of ¼ waveguide length with respect to two dielectric strips as shown in the figure, most of the waves which enter from (1) exit in part to (2), and the other part of the waves leaks to the dielectric strip on the right through the three strip lines a, b and c. In this arrangement, since all waves which exit to (4) and which pass through any strip line are out of phase by the same phase angle, the waves are synthesized so as to be in phase. However, regarding the waves which exit to (3), the waves which pass through the middle strip line (e.g., a strip line b) are delayed in comparison with the waves which pass through the front strip line (e.g., a strip line a) by a phase angle (180 degrees) corresponding to $\lambda g/4 + \lambda g/4 = \lambda g/2$. Therefore, the synthesized waves cancel each other, so no wave appears in the direction of (3).

As a result, the nonradiative dielectric line apparatus works as a directional coupler.

Figure 15A:
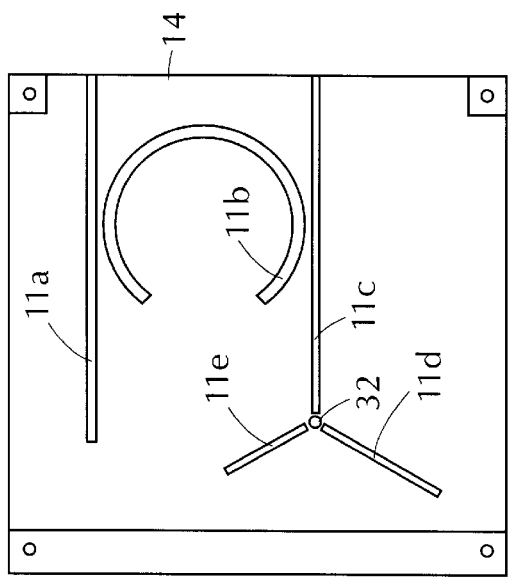
FIGS. 15(A) and 15(B) show the construction of an FM-CW radar front-end portion according to an eleventh embodiment of the present invention.
Figure 15B:
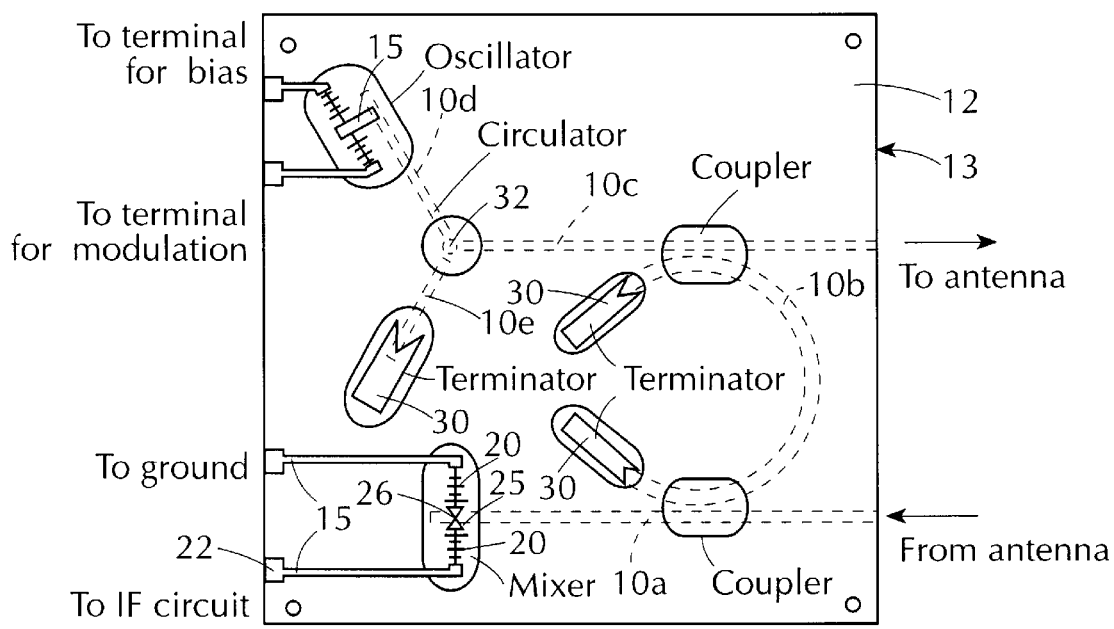
Figure 16:
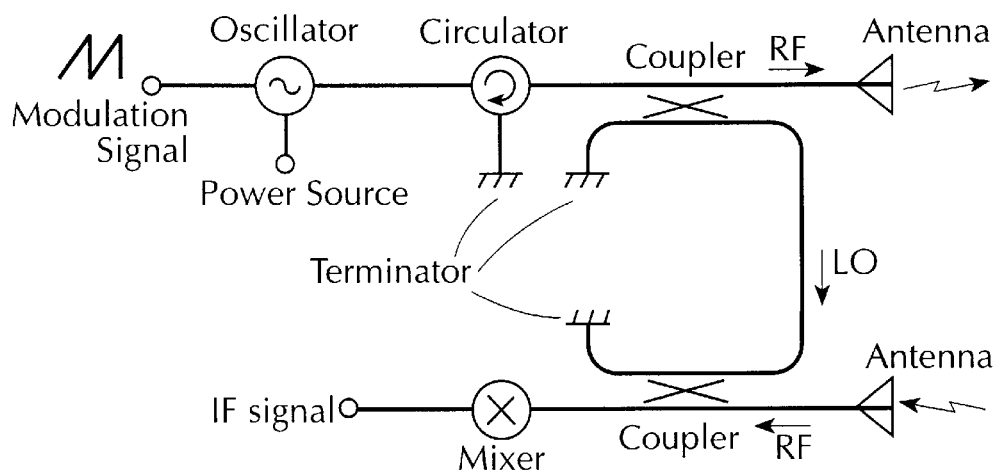
FIG. 16 shows an equivalent circuit of the FM-CW radar front-end portion shown in FIG. 15.

Next, the construction of a nonradiative dielectric line apparatus which works as an FM-CW radar front-end portion according to an eleventh embodiment of the present invention is shown in FIGS. 15(A) and 15(B), and FIG. 16.

FIG. 15(A) shows the internal surface of a conductor plate 14 serving as an upper housing. FIG. 15(B) is a plan view showing a circuit board 12 which is located on a conductor plate 13 serving as a lower housing. Referring to FIGS. 15(A) and 15(B), provided at predetermined positions of the conductor plates 13 and 14 serving as lower and upper housings, respectively, are dielectric strips 10a, 10b, 10c, 10d, 10e, 11a, 11b, 11c, 11d, and lie in mutually facing patterns of mirror symmetry. The circuit board 12 is interposed between these conductor plates 13 and 14. Various conductor film patterns and resistor film patterns which are made to work as an oscillator, a terminator and a mixer, respectively, are formed on the circuit board 12. Of these, the construction of the oscillator portion is the same as that shown in FIGS. 8(A) and 8(B). Further, the construction of the terminator portion is the same as that shown in FIG. 9 or FIG. 10. In the mixer portion of the circuit board 12, various arrangements of a conductor pattern 20 serving as an RF choke, a conductor plate 25 for RF matching, and the strip line 15 are formed. A Schottky barrier diode 26 is mounted on the conductor plate 25. The two dielectric strips 10a and 11a are positioned in such a manner as to sandwich the conductor plate 25.

With this construction, a nonradiative dielectric line is formed by the dielectric strips 10a and 11a, the circuit board 12, and the conductor plates 13 and 14. The electromagnetic wave RF+LO (see FIG. 16) which propagates through the line and the conductor plate 25 are coupled to each other, RF current flows through the Schottky barrier diode 26, an intermediate frequency is generated due to the nonlinearity of the diode, and this signal is taken out at an IF output terminal 22 through the conductor pattern 20. The RF signal and the LO signal are blocked by the conductor pattern 20, and not output at the IF output terminal.

Each of the conductor plates 13 and 14 is provided with a ferrite disk 32 inside and a magnet (not shown) outside. The dielectric strips 10d, 10c, 10e, 11d, 11c, and 11e, the ferrite disk 32, and the magnet constitute a circulator. This circulator, and the terminator formed of the dielectric strips 10e and 11e, and the resistor film 30 constitute an isolator. That is, the waves transmitted from the oscillator are transmitted in the direction of the dielectric strips 10c and 11c, and any reflection waves are consumed by the resistor film 30 and are hardly returned to the oscillator.

The section between the dielectric strips 10b and 11b, and dielectric strips 10c and 11c, and the section between the dielectric strips 10a and 11a, and dielectric strips 10c and 11c work as a coupler. As a result, the transmission waves of RF+LO are input to the above-mentioned mixer.

The end portions of the dielectric strips 10c and 11c are connected to a transmission antenna (not shown), and the end portions of the dielectric strips 10a and 11a are connected to a receiving antenna (not shown). As these antennas, an antenna in which a dielectric strip is formed into a rod shape, and a leakage wave NRD guide antenna are used.

FIG. 16 is an equivalent circuit diagram of the apparatus shown in FIGS. 15(A) and 15(B). When the oscillation frequency of the oscillator is modulated by a triangular wave as shown in the figures, a beat frequency signal, which is representative of the distance from the antenna to a reflection object and the relative speed thereof, is output as an IF signal from the mixer, and by processing the IF signal, the distance to the object and the relative speed are determined.

Figure 17A:
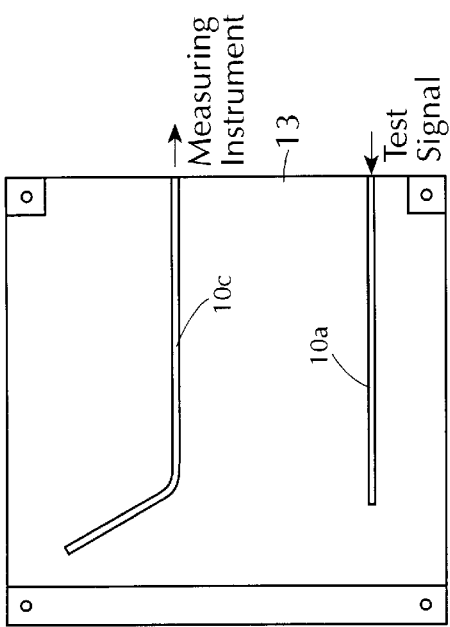
FIGS. 17(A) and 17(B) show the construction of an instrument for measuring characteristics of a circuit board for use in the FM-CW radar front-end portion shown in FIG. 15.
Figure 17B:
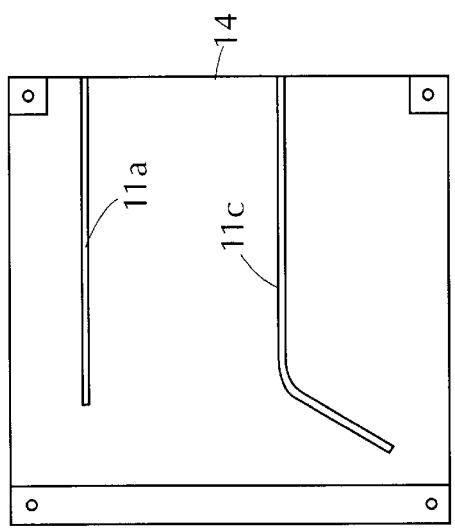
Figure 18:
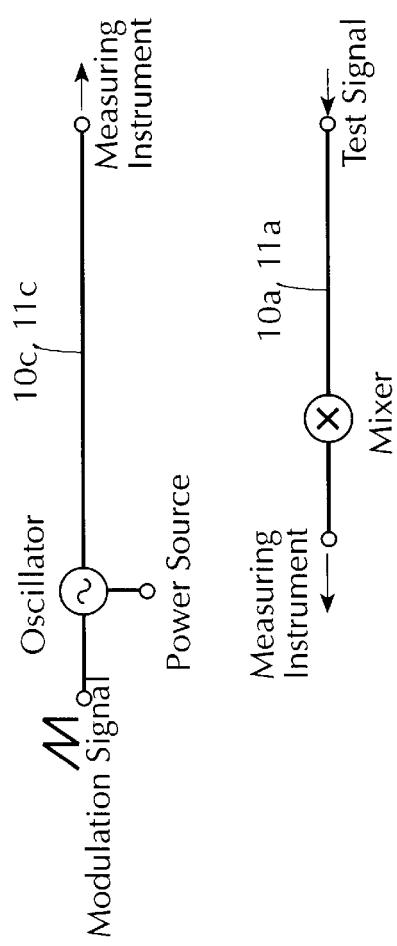
FIG. 18 shows an equivalent circuit of the FM-CW radar front-end portion shown in FIG. 17.

Next, the construction of an instrument for measuring the characteristics of the circuit board for use in the above-described FM-CW radar front-end portion is shown in FIGS. FIGS. 17(A) and 17(B), and FIG. 18.

FIG. 17(A) shows the internal surface of a conductor plate 14 serving as an upper housing. FIG. 17(B) is a plan view of a conductor plate 13 serving as a lower housing. Provided at predetermined positions of the conductor plates 13 and 14 are dielectric strips boa, 10c, 11a, 11c in mutually facing patterns of mirror symmetry. Unlike that shown in FIGS. 15(A) and 15(B), here, the dielectric strips 10b and 11b which constitute the coupler, and the dielectric strips 10e and 11e which constitute the circulator are not provided. The circuit board 12 is interposed between these conductor plates 13 and 14. FIG. 18 is an equivalent circuit diagram in such a state.

As described above, a measuring instrument is connected to the end portions of the dielectric strips 10c and 11c via the nonradiative dielectric line (the waveguide converter). As a result, it is possible to measure the characteristics solely of the oscillator. Further, by connecting a test signal generator to the end portions of the dielectric strips 10a and 11a via the nonradiative dielectric line (the waveguide converter) and by measuring the IF output signal of the circuit board, the characteristics solely of the mixer can be measured.

Figure 19:
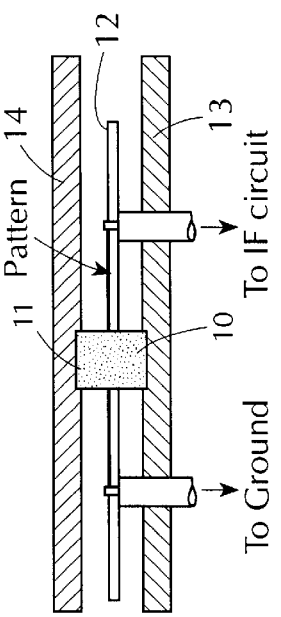
FIG. 19 shows another example of the construction of a mixer portion shown in FIG. 15.
Figure 20A:
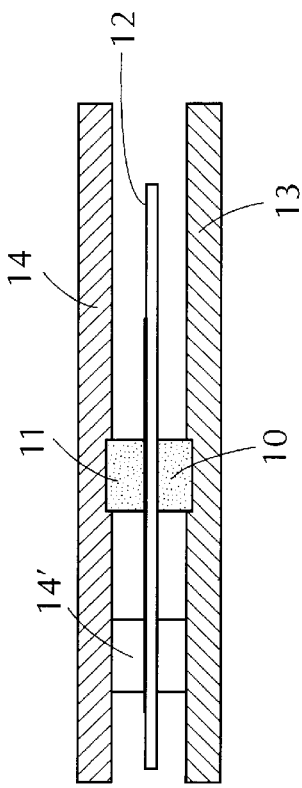
FIGS. 20(A) and 20(B) show another example of the construction of the mixer portion shown in FIG. 15.
Figure 20B:
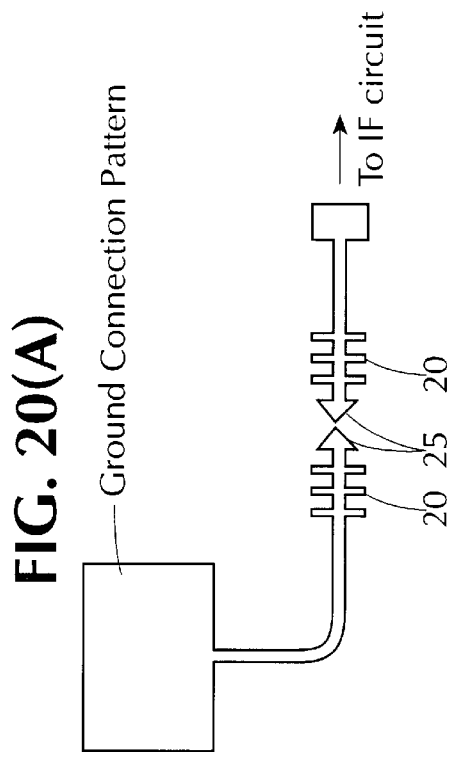

In the example shown in FIGS. 15(A) and 15(B), a strip line is formed from the mixer portion to the end portion of the circuit board. However, for example, as shown in FIG. 19, the strip line may be connected to the IF output circuit and to ground by coaxial cables which go through the lower conductor plate. Further, as shown in FIG. 20(A), it may be possible to form a pattern for connection to ground on the circuit board beforehand and make connection to ground by making this portion contact a projection portion 14' provided on the conductor plate 14 as shown in FIG. 20(B).

Figure 21A:
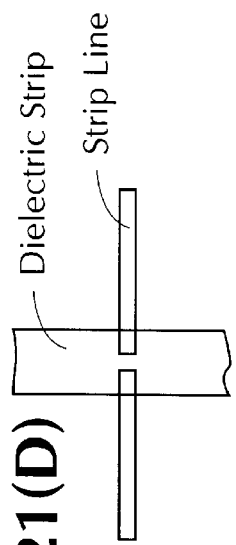
FIGS. 21(A), 21(B), 21(C) and 21(D) show the positional relationship between the dielectric strip and the strip line.
Figure 21B:
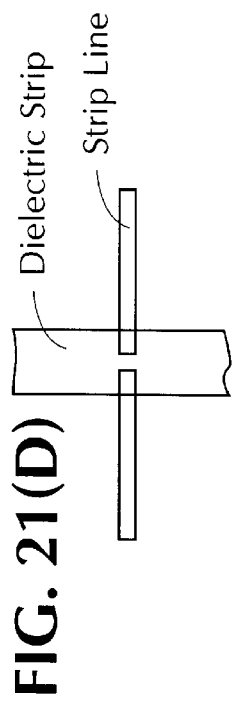
Figure 21C:
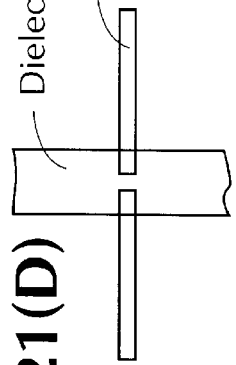
Figure 21D:
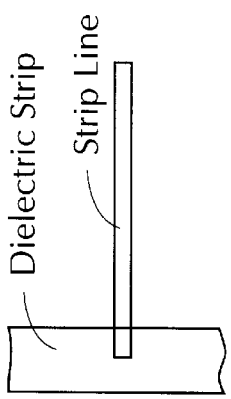

As shown in FIGS. 21(A) and 21(C), the above-described embodiments describe examples in which a strip line is positioned close to a dielectric strip or a part of a strip line is made to penetrate into the interior of the dielectric strip. In addition to this, as shown in FIG. 21(B), it may be possible to bring the end portion of the dielectric strip and the end portion of the strip line into alignment with each other. Further, as shown in FIG. 21(D), it may be possible to connect strip lines by placing them symmetrically with respect to the dielectric strip.

Figure 22A:
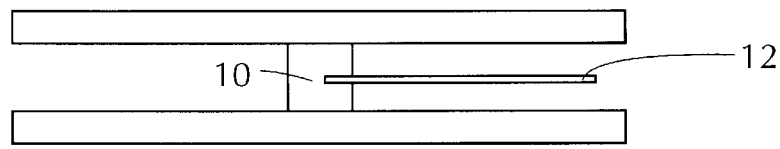
FIGS. 22(A), 22(B), 22(C) and 22(D) show examples of the placement of the circuit board within the nonradiative dielectric line.

Further, the above-described embodiments describe examples in which a circuit board is positioned in such a manner as to be interposed between separated dielectric strips. In addition, for example, as shown in FIG. 22(A), it may be possible to insert the end portion of the circuit board 12 into the side portion of the dielectric strip.

Figure 22B:
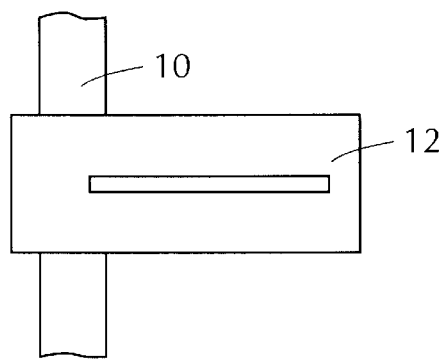

Further, the above-described embodiments describe examples in which a relatively large circuit board having substantially the same size as those of the upper and lower conductor plates is used. In addition, for example, as shown in FIG. 22(B), it may be possible to bring the circuit board 12 close to, or to insert it into, only a part of the dielectric strip.

Figure 22C:
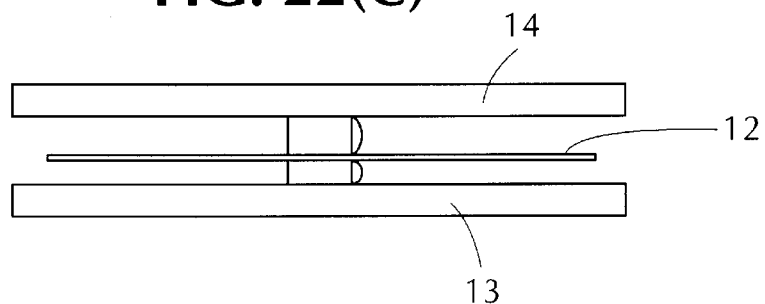

Further, although the above-described embodiments describe examples in which the circuit board 12 is positioned at a substantially intermediate position between two conductor plates, as shown in FIG. 22(C), it may be possible to vary the distance from the conductor plates as required.

Figure 22D:
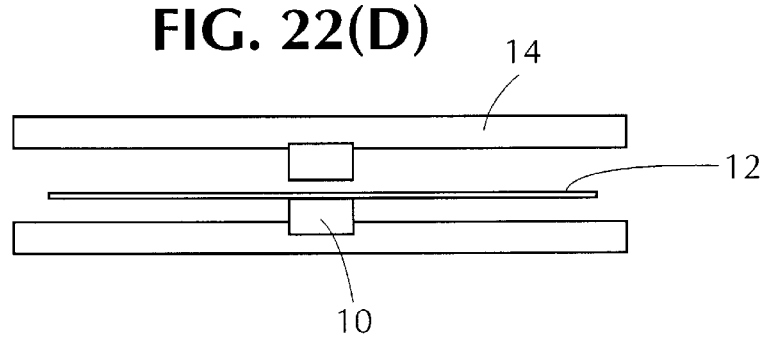

In addition, in some of the above-described embodiments, the circuit board 12 is positioned in close contact between the dielectric strips which are separated to be upper and lower dielectric strips. However, for example, as shown in FIG. 22(D), it may be possible for the circuit board 12 to be separated from one or both of the dielectric strips.

In all the embodiments described up to this point, a nonradiative dielectric line apparatus employing an $LSM_{01}$ mode is described. However, the present invention can also be applied to a line employing an $LSE_{01}$ mode as well. An example thereof will be described below with reference to FIG. 23(A) to FIG. 25(B).

Figure 23A:
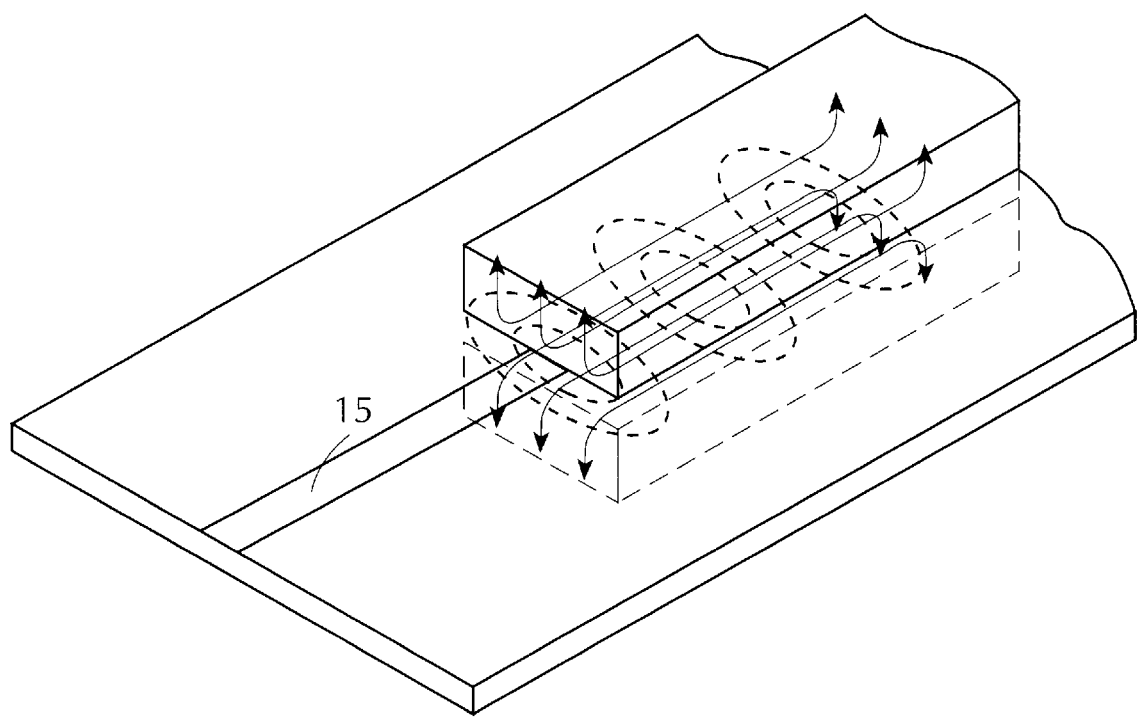
FIGS. 23(A) and 23(B) show the relationship between the electromagnetic-field distribution of the nonradiative dielectric line and the electromagnetic-field distribution of the strip line.
Figure 23B:
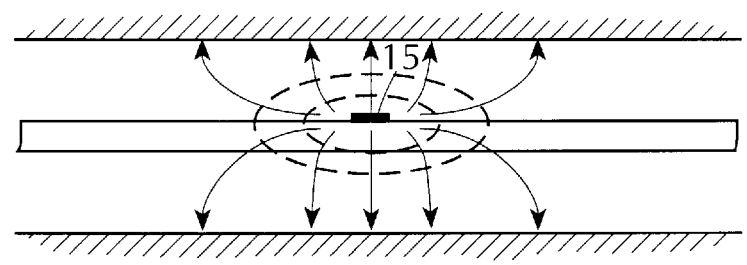

FIG. 23(A) shows the electromagnetic-field distribution of the $LSE_{01}$ mode. However, the illustration of the upper and lower conductor plates is omitted. FIG. 23(B) shows the electromagnetic-field distribution of the strip line.

Referring to FIGS. 23(A) and 23(B), the solid lines indicate lines of electric force, and the dotted lines indicate lines of magnetic force. Although the electromagnetic-field distribution varies according to the dielectric constant of the circuit board and the dielectric constant of the dielectric strip, since basically the LSE mode is a mode in which the magnetic field is parallel to the end surface of the strip line, the dielectric strip and the strip line 15 which extends in the transmission direction thereof are electromagnetically coupled to each other.

Figure 24A:
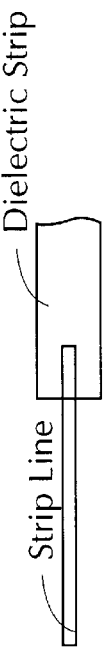
FIGS. 24(A), 24(B) and 24(C) show the positional relationship between the dielectric strip and the strip line.
Figure 24B:
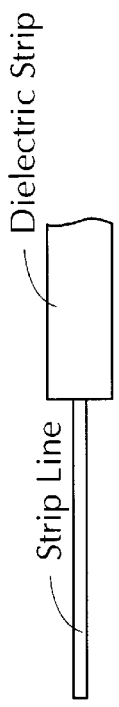
Figure 24C:
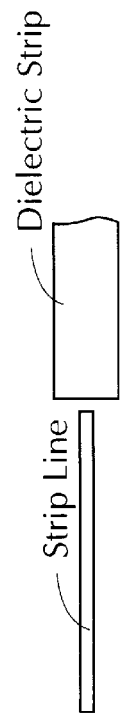

FIGS. 24(A), 24(B) and 24(C) show the positional relationship between the dielectric strip and the strip line. When the strip line is positioned in such a manner as to be close to the end portion of the dielectric strip or to penetrate into the inside of the dielectric strip, the nonradiative dielectric line formed of the dielectric strip and the conductor plates above and below the dielectric strip and the strip line are coupled to each other in the $LSE_{01}$ mode.

Figure 25B:
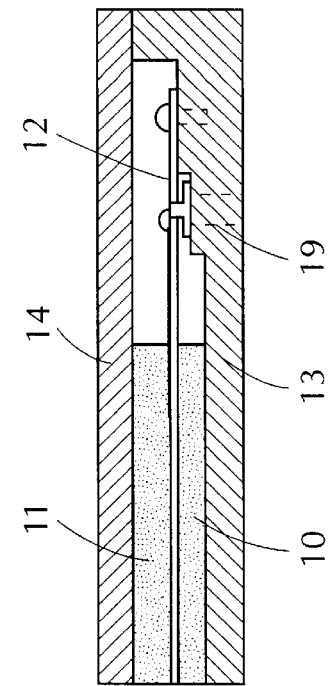
FIGS. 25(A) and 25(B) show the construction of the nonradiative dielectric line apparatus for use as oscillator, which nonradiative dielectric line apparatus uses an $LSE_{01}$ mode.
Figure 25A:
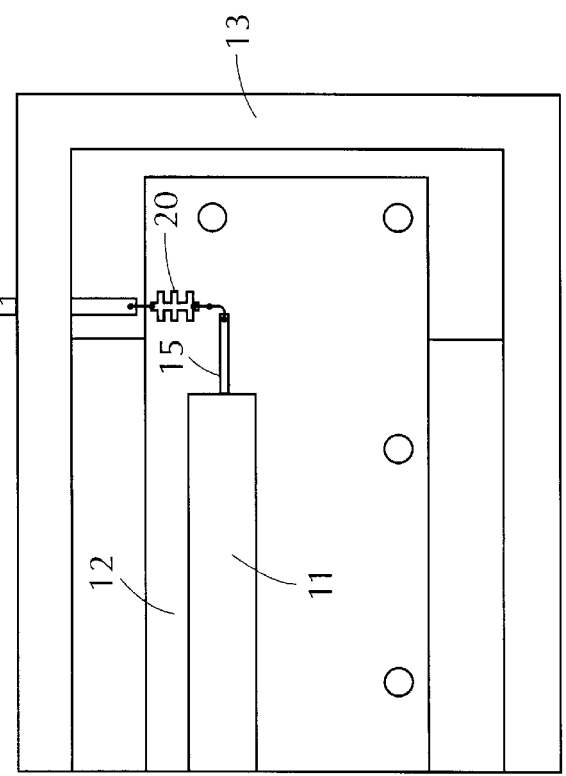

FIGS. 25(A) and 25(B) show the construction of a nonradiative dielectric line apparatus for use as an oscillator. FIG. 25(A) is a top plan view in which the upper conductor plate is removed, and FIG. 25(B) is a sectional view thereof. Referring to FIGS. 25(A) and 25(B), reference numerals 13 and 14 denote conductor plates which constitute the lower housing and the upper housing, respectively, with the dielectric strips 10 and 11 being mounted at respective predetermined positions. As a result, the dielectric strip 10, and the internal surfaces of the conductor plates 13 and 14 form a nonradiative dielectric line. The circuit board 12 is fixedly secured to the conductor plate 13, and the strip line 15 and the conductor pattern 20 which serves as an RF choke are provided on the circuit board 12. The Gunn diode 19 is secured to the conductor plate 13 by screws with its terminals being wire-bonded to the strip line 15 and one end of the conductor pattern 20. Further, a bias terminal 21 is mounted on the conductor plate 13, and its end in the interior of the conductor plate 13 is connected to the end of the conductor pattern 20. With this construction, by applying a DC bias to the Gunn diode 19, the Gunn diode 19 oscillates, its oscillation signal is propagated through the strip line 15, the strip line 15 and the above-described dielectric line are connected to each other, and the signal is propagated through the nonradiative dielectric line.

Figure 26A:
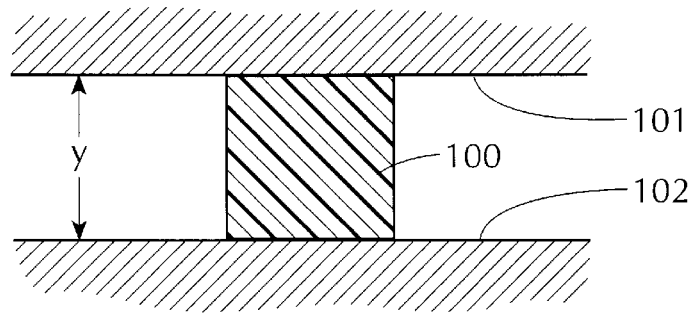
FIGS. 26(A), 26(B) and 26(C) show the construction of a conventional nonradiative dielectric line.
Figure 26B:
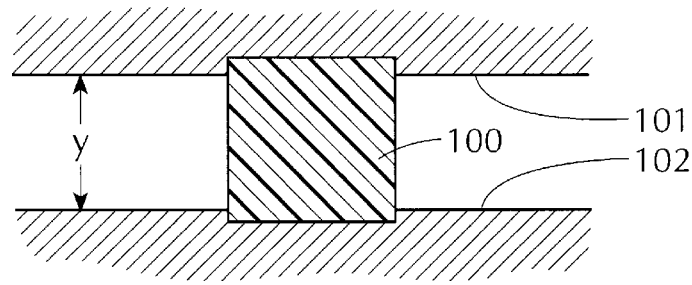
Figure 26C:
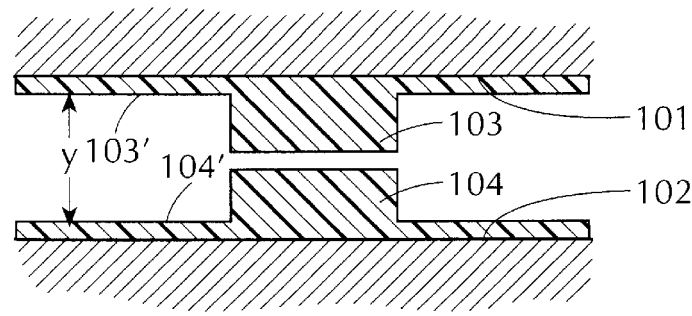
Figure 28:
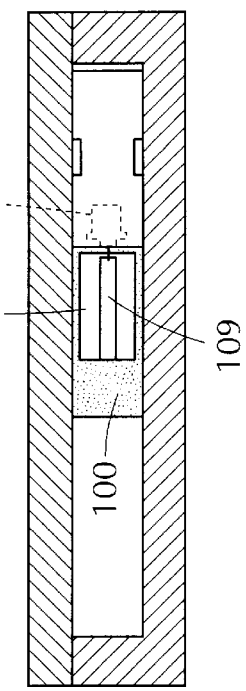
FIG. 28 shows the construction of the conventional nonradiative dielectric line apparatus for use as an oscillator.
Figure 27:
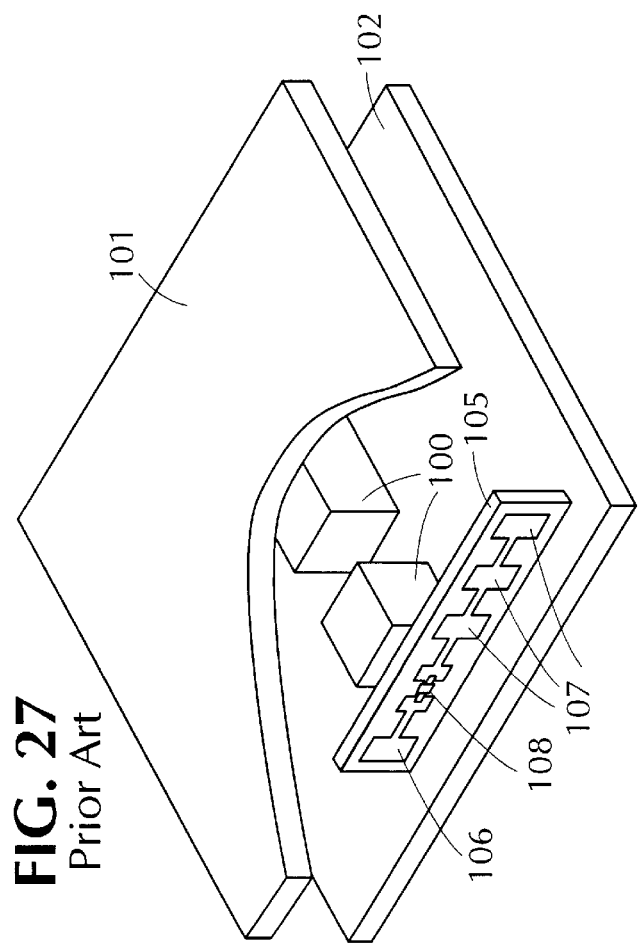
FIG. 27 is a partially cutaway perspective view illustrating the construction of the conventional nonradiative dielectric line apparatus having a beam-lead diode mounting section.

Although in each of the above-described embodiments the grooved-type nonradiative dielectric line shown in FIG. 26(B) is formed, the same applies to the normal-type nonradiative dielectric line shown in FIG. 26(A) or the window-type nonradiative dielectric line shown in FIG. 26(C) as well.

A description will be given below of the analysis results in a case in which the dimensions and the materials of the sections of various types of nonradiative dielectric line are varied when the propagation frequency of the circuit is set at 60 GHz.

Figure 29:
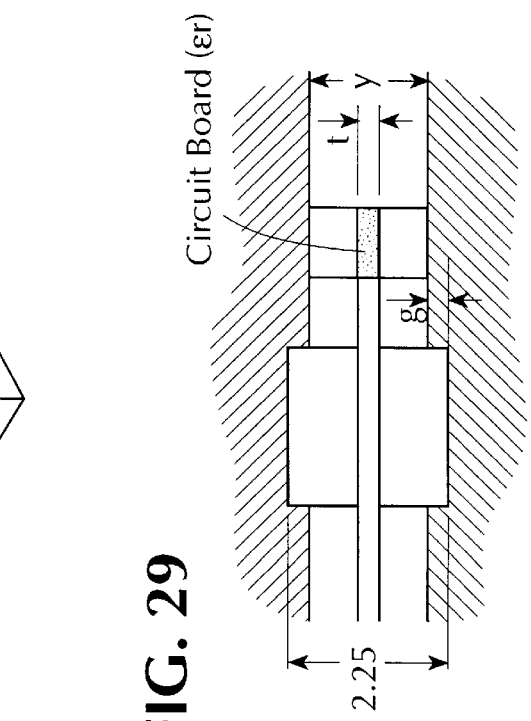
FIG. 29 shows a calculation model used when the relationship is determined between the dimensions, materials of the sections of the nonradiative dielectric line, and the cutoff frequency.

Initially, as shown in FIG. 29, the cutoff frequency is determined in a case in which the total thickness is denoted as y when a circuit board is inserted into that portion (hereinafter referred to as a cutoff portion) where there is no dielectric strip from among the nonradiative dielectric line, the board thickness is denoted as t, and the dielectric constant of the board is denoted as $\epsilon r$.

Figure 31:
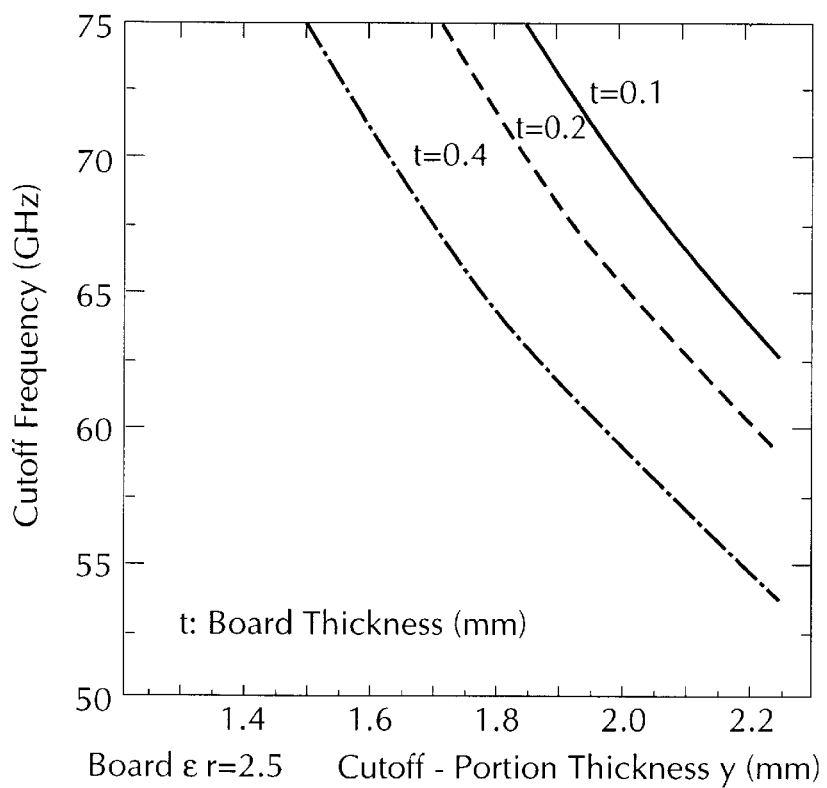
FIG. 31 shows the relation of the cutoff frequency with respect to the cutoff section thickness when the thickness dimension of the circuit board is varied with the dielectric constant of the circuit board kept constant.
Figure 32:
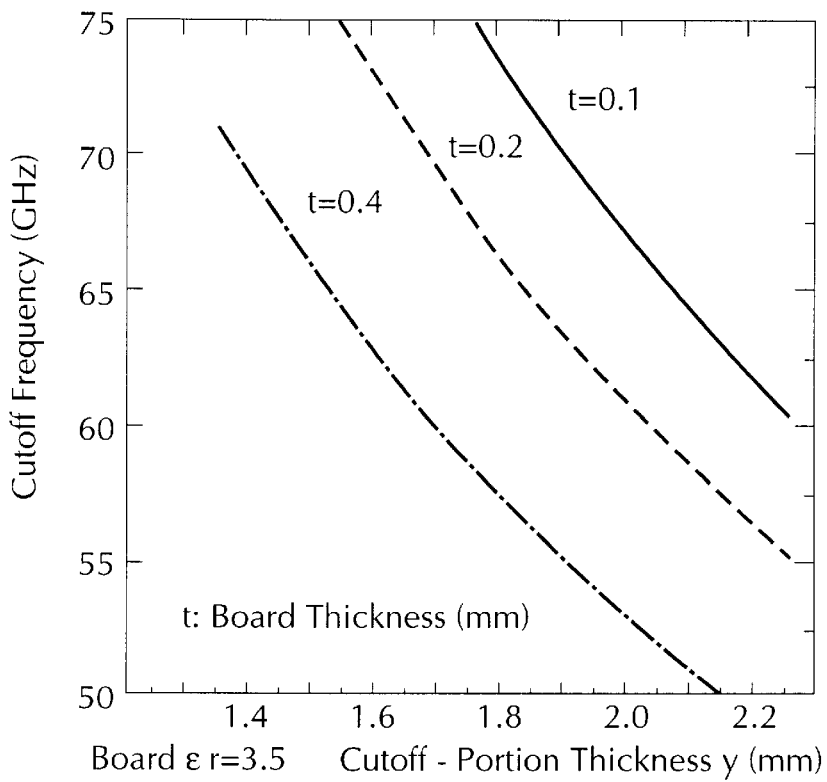
FIG. 32 shows the relation of the cutoff frequency with respect to the cutoff section thickness when the thickness dimension of the circuit board is varied with the dielectric constant of the circuit board kept constant.
Figure 33:
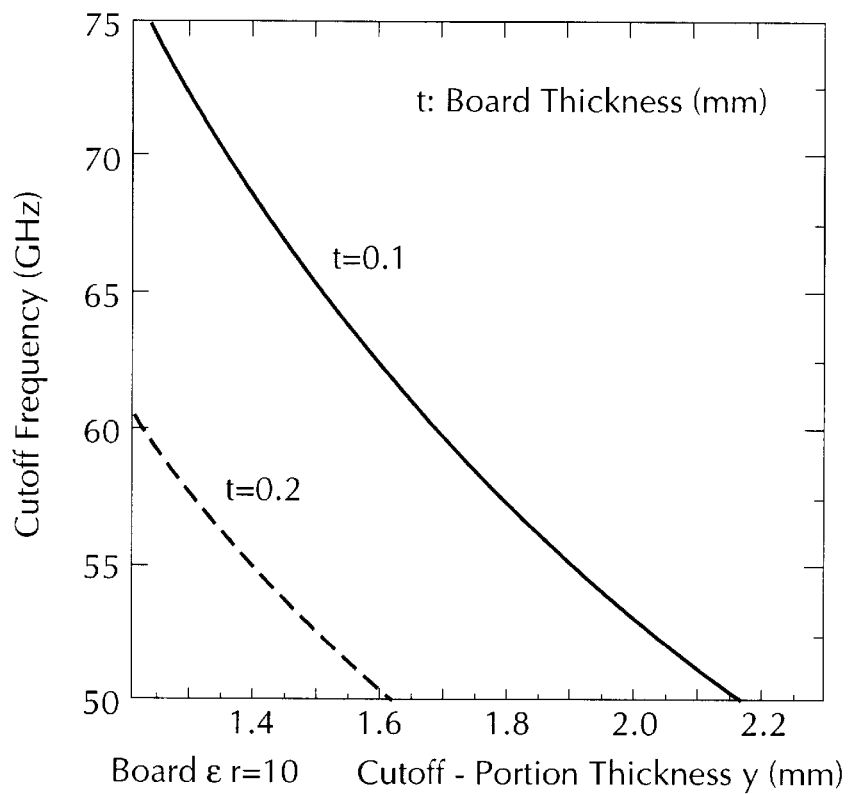
FIG. 33 shows the relation of the cutoff frequency with respect to the cutoff section thickness when the thickness dimension of the circuit board is varied with the dielectric constant of the circuit board kept constant.

FIGS. 31 to 33 show the relationship between the cutoff portion thickness y and the cutoff frequency when the board thickness t is varied by using boards of mutually different dielectric constants. FIG. 31 shows an example in which the dielectric constant $\epsilon r$ of the circuit board is set at 2.5. For example, when the board thickness t is 0.4 mm, the cutoff portion thickness y when a design is made with, for example, the cutoff frequency of the cutoff portion being set at 66.7 GHz is 1.7 mm. FIG. 32 shows an example in which the dielectric constant $\epsilon r$ of the circuit board is set at 3.5. For example, when the board thickness t is 0.2 mm, the cutoff-portion thickness y at which the cutoff frequency becomes 66.7 GHz is 1.75 mm. FIG. 33 shows an example in which the dielectric constant $\epsilon r$ of the circuit board is set at 10. When the board thickness t is 0.1 mm, the cutoff-portion thickness y at which the cutoff frequency of the cutoff portion becomes 66.7 GHz is 1.45 mm.

Generally speaking, in comparison with a normal-type nonradiative dielectric line in which a circuit board is not inserted, when a circuit board having a certain dielectric constant is inserted into its cutoff portion, the cutoff frequency of the electromagnetic wave having polarized planes parallel to the upper and lower conductor plates decreases. For this reason, in order to obtain the predetermined cutoff frequency of 66.7 GHz, it is necessary to lessen the space between the upper and lower conductor plates of the cutoff portion. The cutoff portion thickness y and the grooved depth g at which the cutoff frequency of the cutoff portion becomes cutoff frequency becomes 66.7 GHz, which are determined from the results of FIGS. 31 to 33, are shown in the table below.

TABLE 1

| y[mm] (g[mm]) | Board Thickness t[mm] | | |
|---|---|---|---|
| $\epsilon r$ | 0.1 | 0.2 | 0.4 |
| 2.5 | 2.1(0.075) | 1.95(0.15) | 1.7(0.275) |
| 3.5 | 2.0(0.125) | 1.75(0.25) | 1.45(0.4) |
| 10 | 1.45(0.4) | | | where the grooved depth g is determined on the basis of g=(2.25−y)/2.

Figure 30:
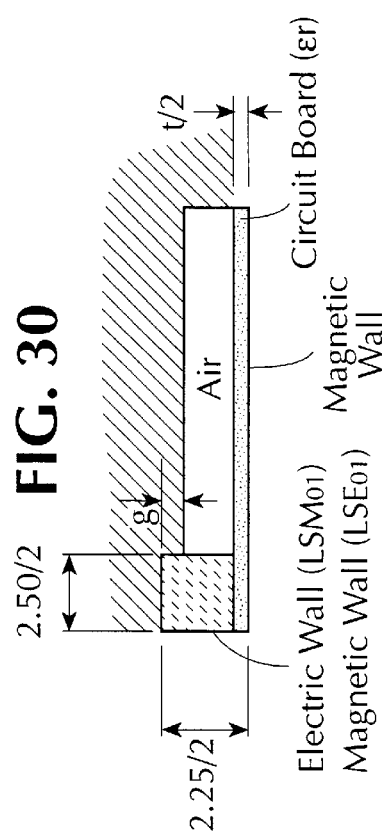
FIG. 30 shows a calculation model used when the dispersion curve and the transmission loss of the nonradiative dielectric line are determined.

Next, for the model of FIG. 30, the dispersion curve and the transmission loss are determined on the basis of the parameters of the following Table 2.

TABLE 2

Figure 34:
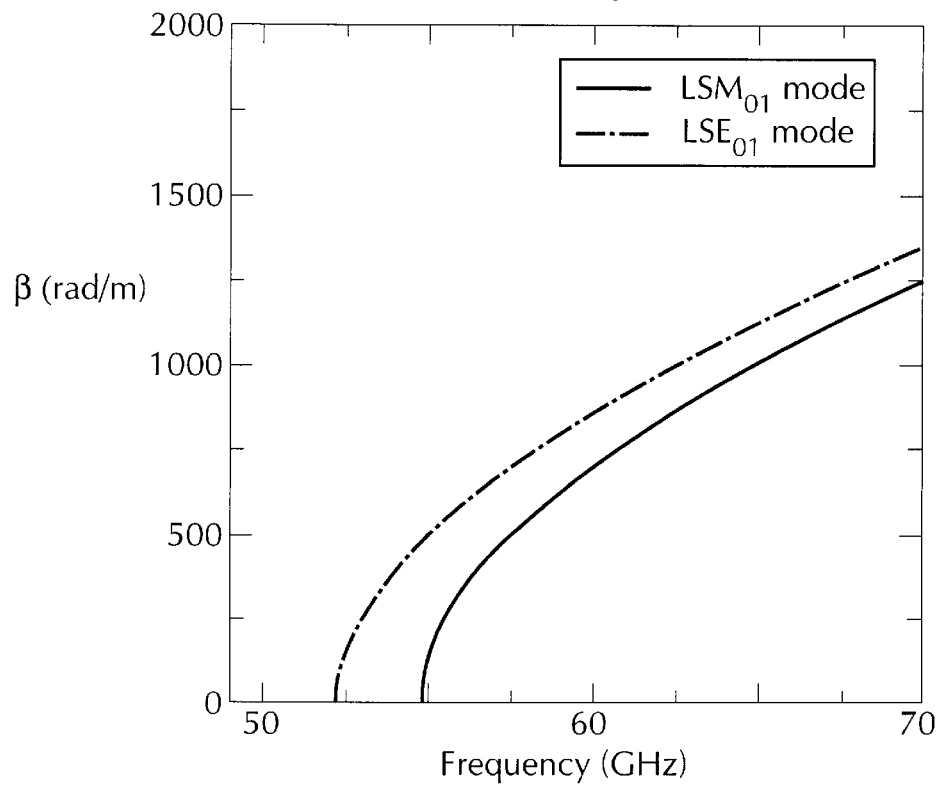
FIG. 34 shows the dispersion curve under predetermined set conditions.
Figure 35:
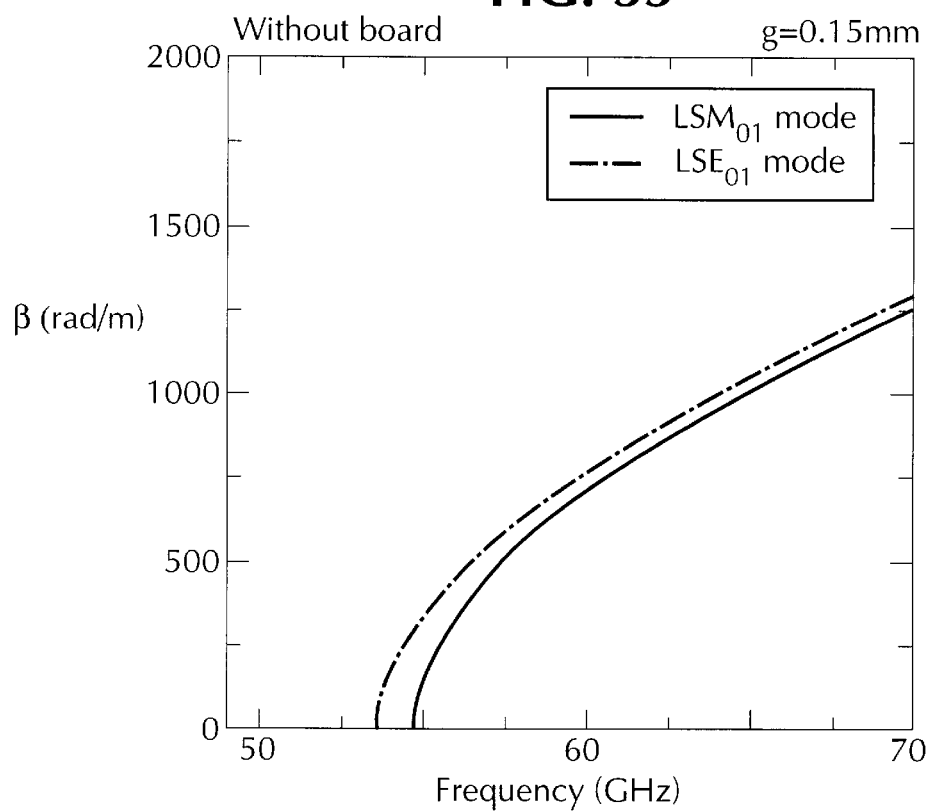
FIG. 35 shows the dispersion curve under the predetermined set conditions.
Figure 36:
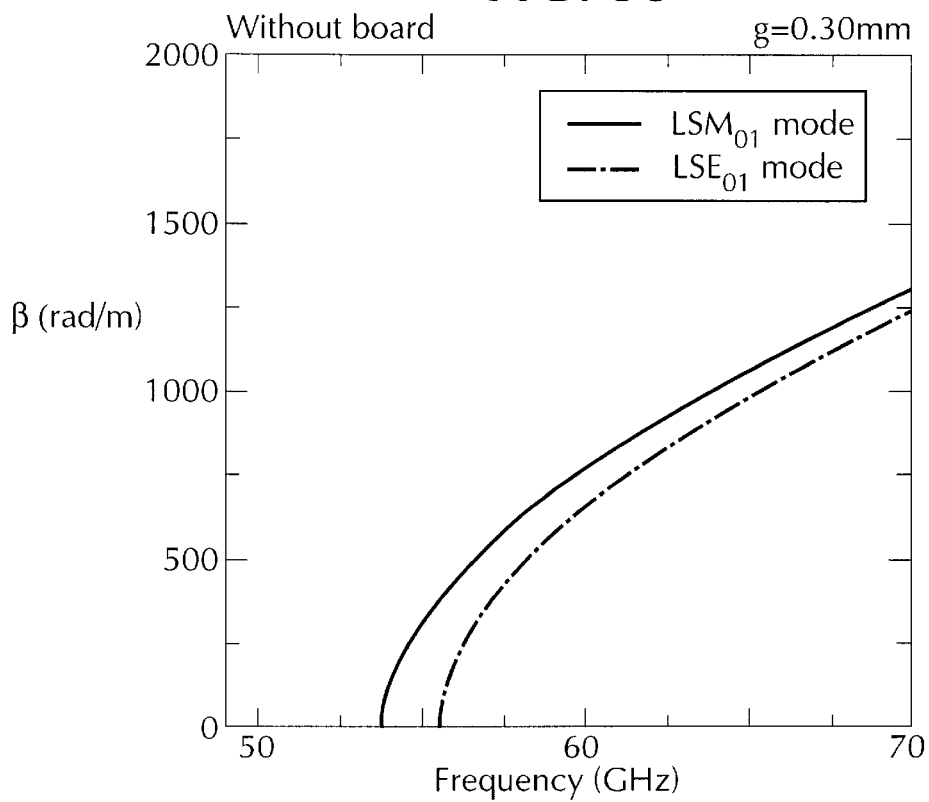
FIG. 36 shows the dispersion curve under the predetermined set conditions.
Figure 37:
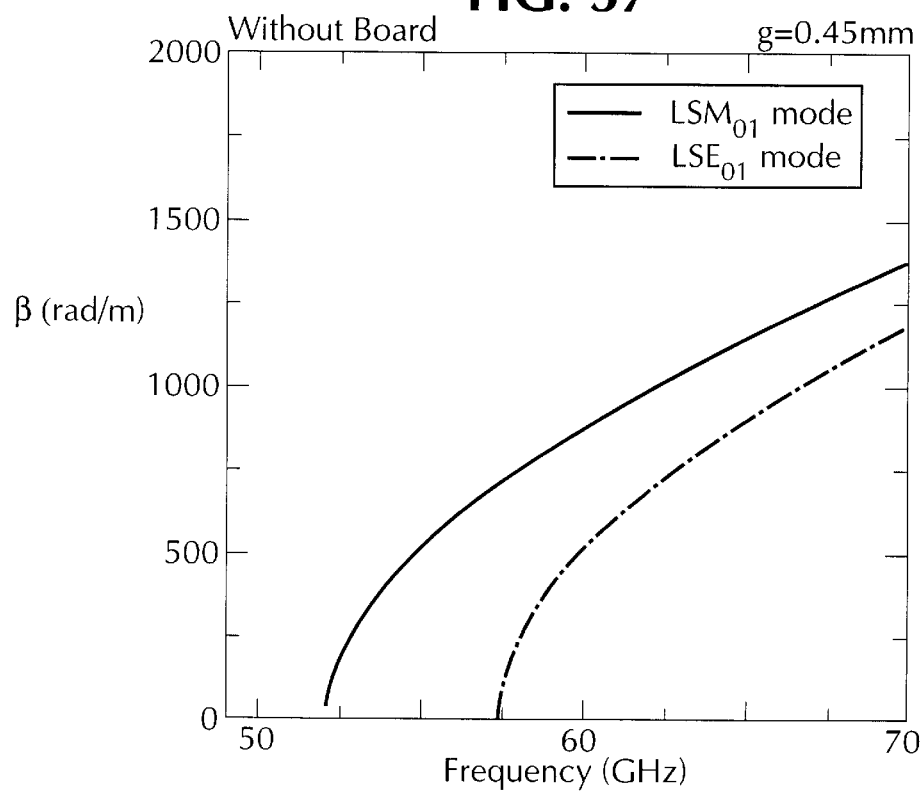
FIG. 37 shows the dispersion curve under the predetermined set conditions.
Figure 38:
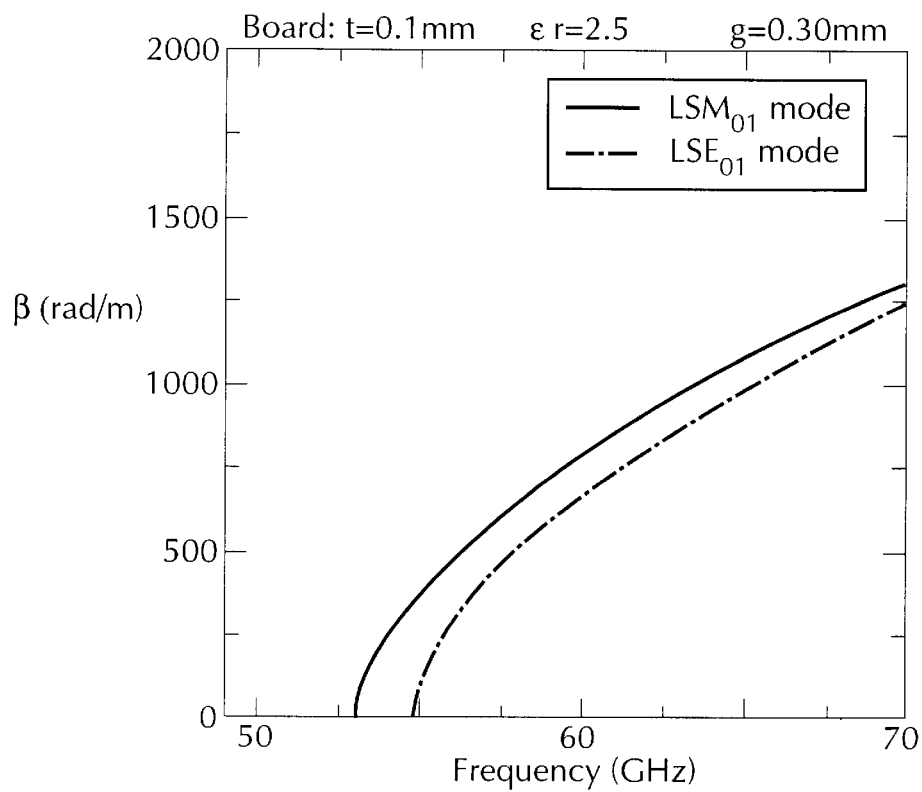
FIG. 38 shows the dispersion curve under the predetermined set conditions.
Figure 39:
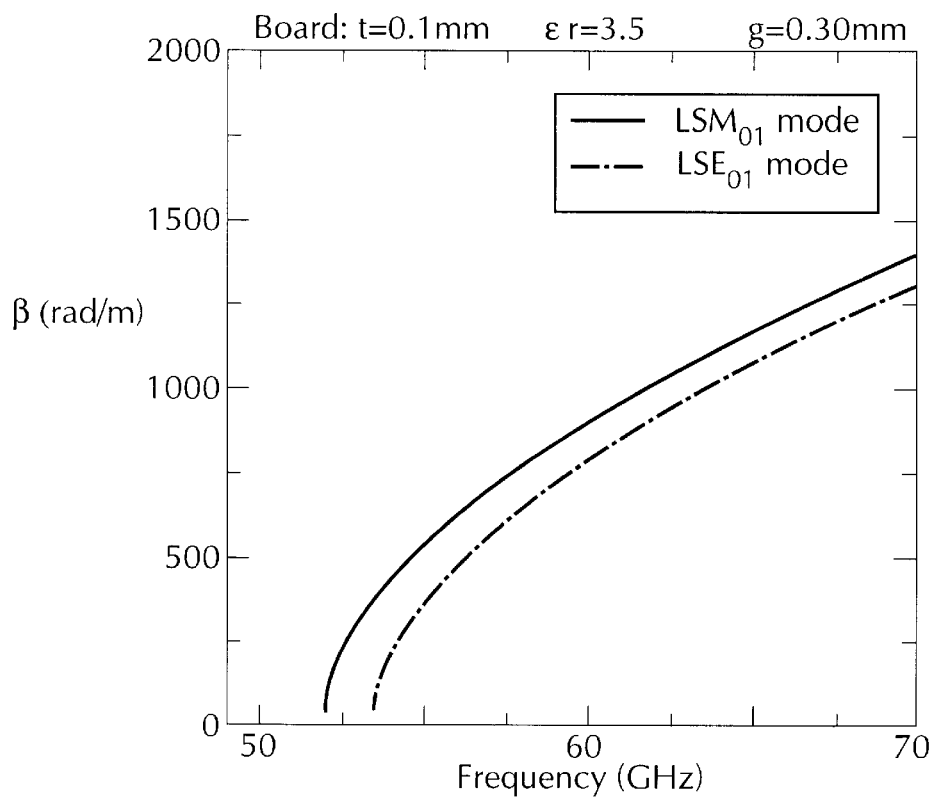
FIG. 39 shows the dispersion curve under the predetermined set conditions.
Figure 43:
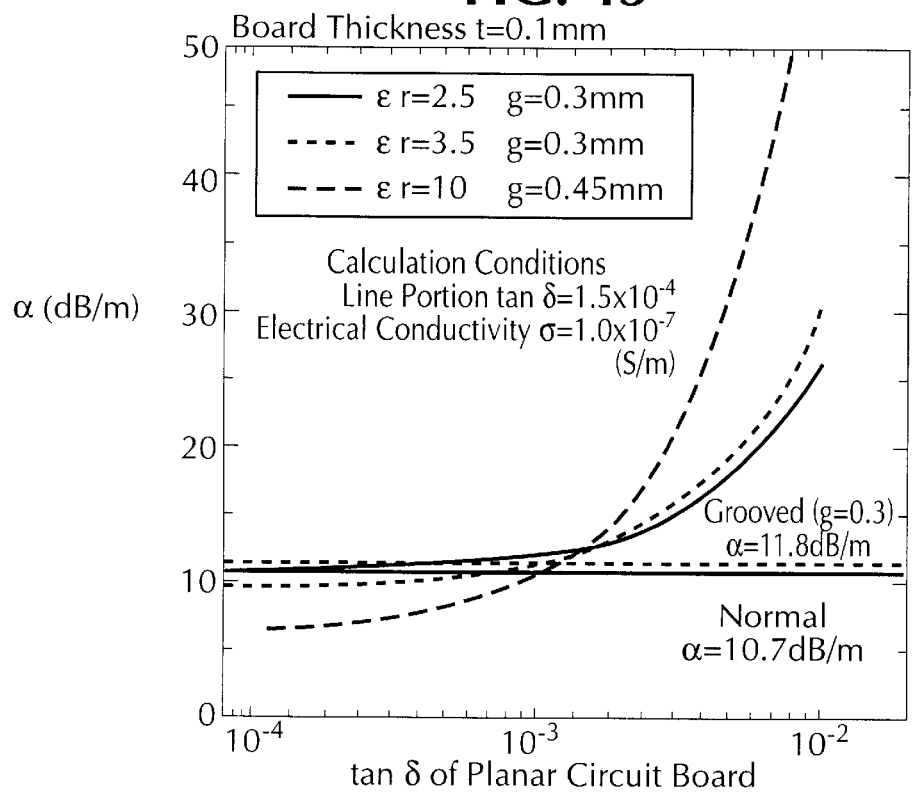
FIG. 43 shows the results of the transmission loss under each set condition.
Figure 47:
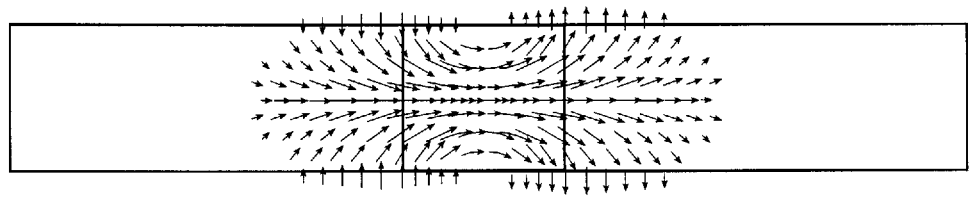
FIG. 47 shows the electric-field distribution of the normal-type nonradiative dielectric line.
Figure 48:
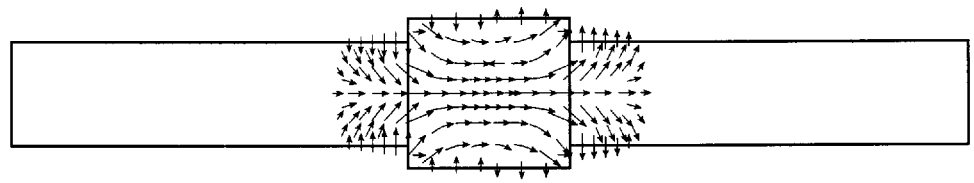
FIG. 48 shows the electric-field distribution of the grooved-type nonradiative dielectric line.
Figure 49:
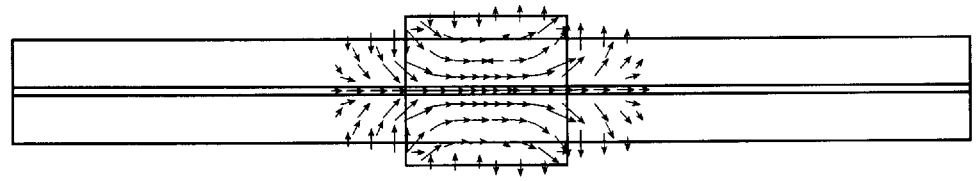
FIG. 49 shows the electric-field distribution of the nonradiative dielectric line which is of a grooved type and in which a circuit board is inserted at the intermediate position.

| Line | | Board | | Disper- | Trans- | Electric-field |
|---|---|---|---|---|---|---|
| No. | Struc-ture | g(mm) | Thick-ness | $\epsilon r$ | sion Curve | mission Loss | Distribu-tion |
| 1 | Normal | 0.00 | | | FIG. 34 | | FIG. 47 |
| 2 | Groov- | 0.15 | | | FIG. 35 | | |
| 3 | ed | 0.30 | | | FIG. 36 | | FIG. 48 |
| 4 | | 0.45 | | | FIG. 37 | | |
| 5 | | 0.30 | 0.1 | 2.5 | FIG. 38 | FIG. 43 | FIG. 49 |
| 6 | | | | 3.5 | FIG. 39 | | |

TABLE 2-continued

Figure 40:
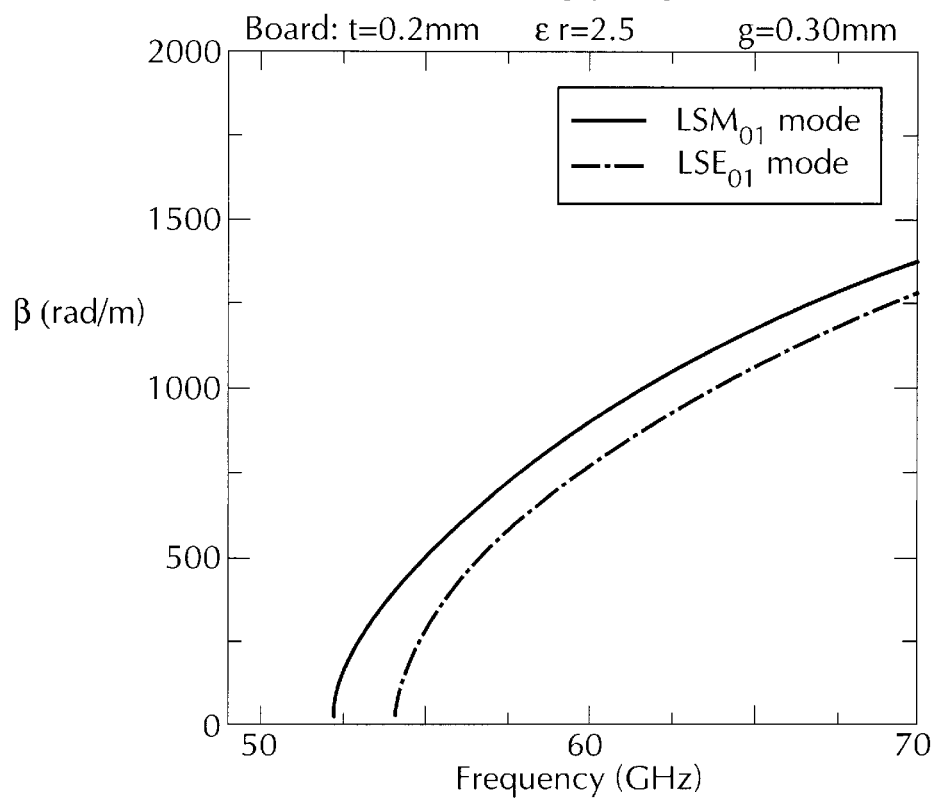
FIG. 40 shows the dispersion curve under the predetermined set conditions.
Figure 41:
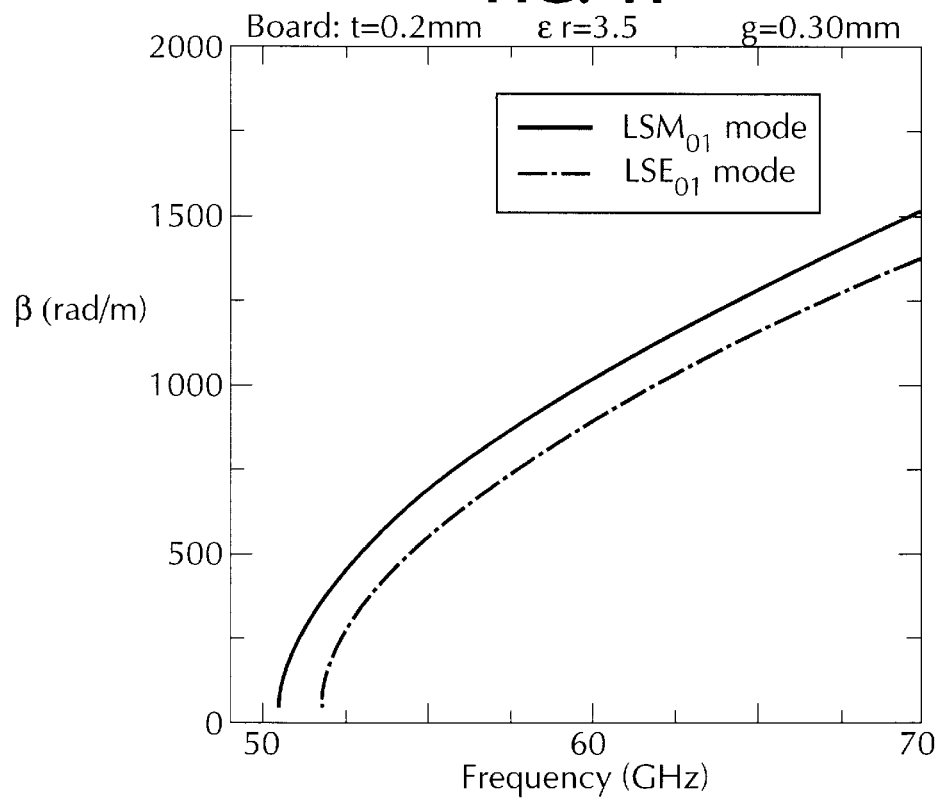
FIG. 41 shows the dispersion curve under the predetermined set conditions.
Figure 42:
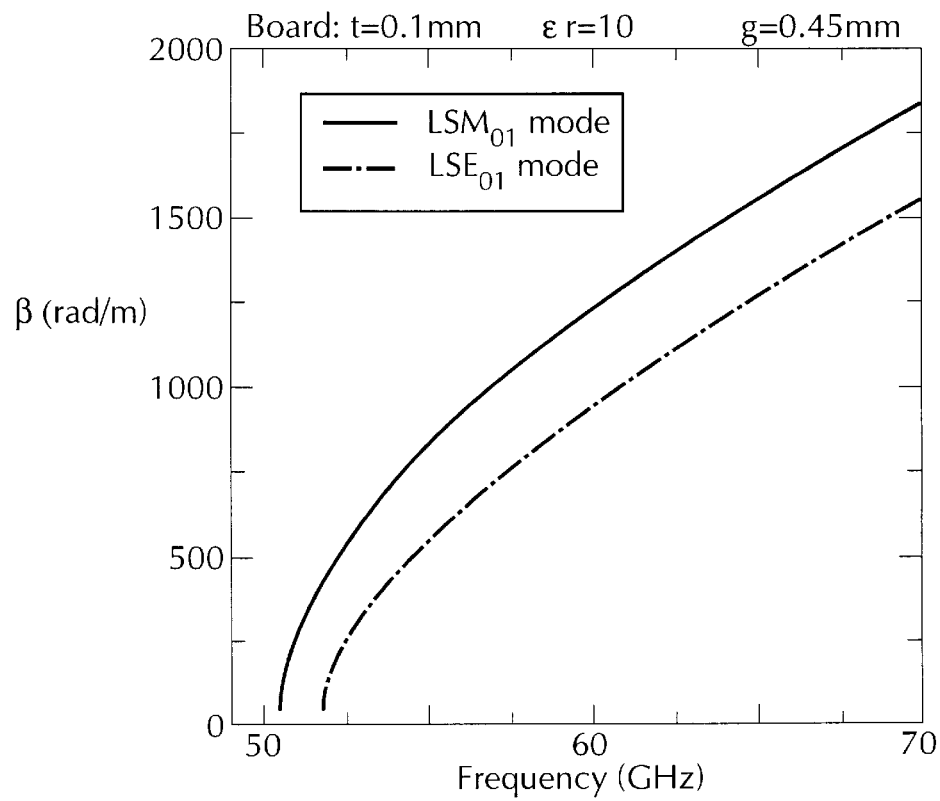
FIG. 42 shows the dispersion curve under the predetermined set conditions.
Figure 44:
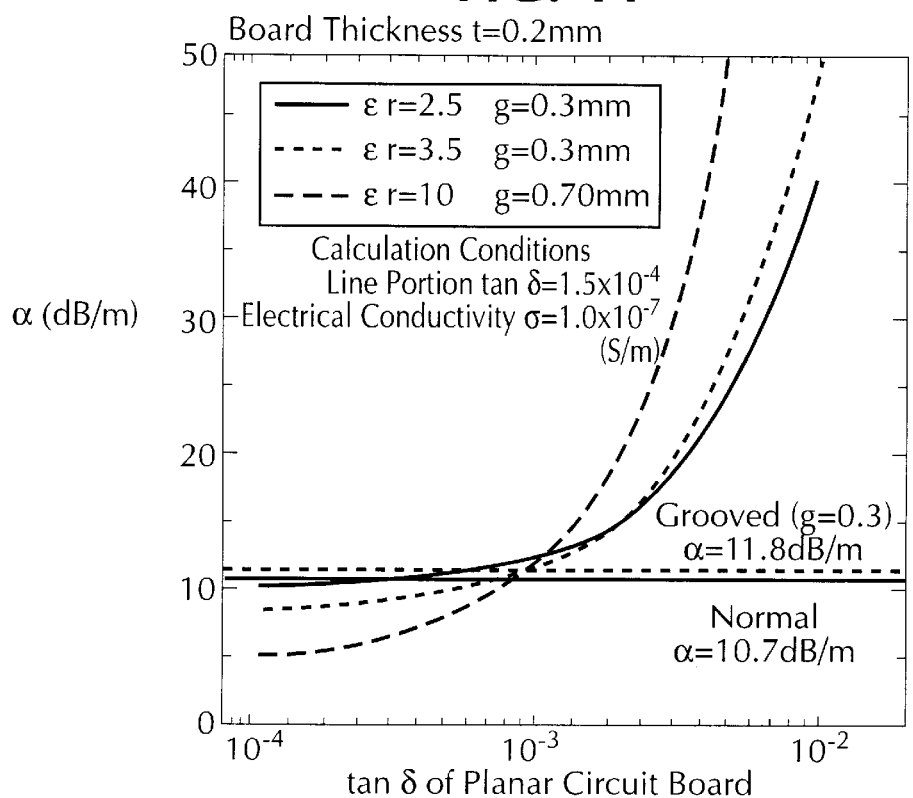
FIG. 44 shows the results of the transmission loss under each set condition.
Figure 45:
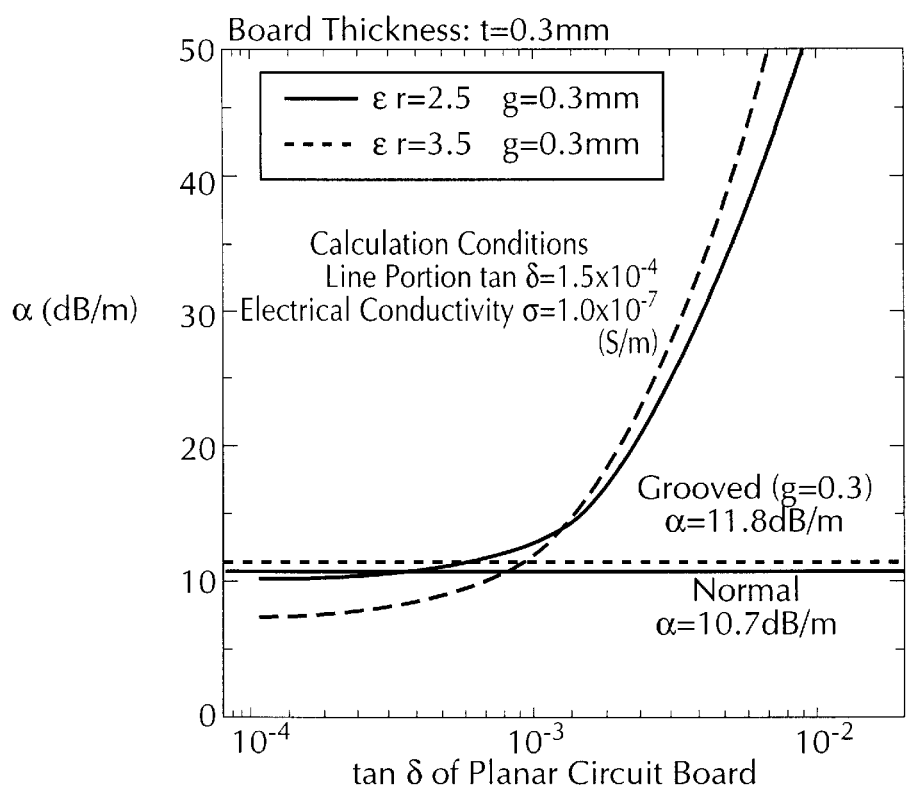
FIG. 45 shows the results of the transmission loss under each set condition.
Figure 46:
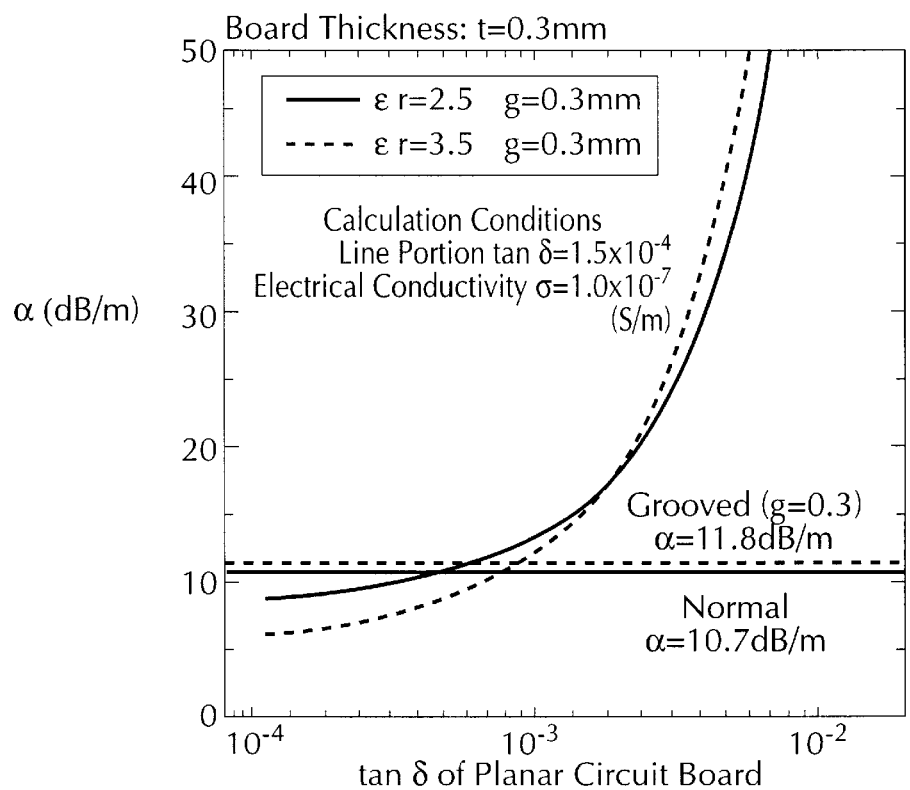
FIG. 46 shows the results of the transmission loss under each set condition.

| Line | | Board | | Disper- | Trans- | Electric-field |
|---|---|---|---|---|---|---|
| No. | Struc-ture | g(mm) | Thick-ness | $\epsilon r$ | sion Curve | mission Loss | Distribu-tion |
| 7 | | | 0.2 | 2.5 | FIG. 40 | FIG. 44 | |
| 8 | | | | 3.5 | FIG. 41 | | |
| 9 | | | 0.3 | 2.5 | | FIG. 45 | |
| 10 | | | | 3.5 | | | |
| 11 | | | 0.4 | 2.5 | | FIG. 46 | |
| 12 | | | | 3.5 | | | |
| 13 | | 0.45 | 0.1 | 10 | FIG. 42 | FIG. 43 | | where the dielectric constant of the dielectric strip is 2.04, $\tan\delta$ is $1.5\times10^{-4}$, and $\tan\delta$ of the circuit board is 0.01 to 0.0001.

It can be seen from FIGS. 34 to 37 that when the dispersion curves of the normal-type nonradiative dielectric line and the grooved-type nonradiative dielectric line are compared with each other, as the grooved depth g becomes greater, the lowest-order mode varies from the $LSE_{01}$ mode to the $LSM_{01}$ mode. Here, since the $LSM_{01}$ mode and the $LSE_{01}$ mode overlap each other between g=0.15 and 0.30 mm, it is necessary to avoid a design in which the grooved depth g falls within this range. Further, since at g=0.45 mm, the difference between the $LSM_{01}$ mode and the $LSE_{01}$ mode becomes wider, transmission in the single mode of the $LSM_{01}$ mode is made possible by determining the groove depth g.

Further, it can be seen from the results of FIGS. 38 to 41 that even if a circuit of a low dielectric constant, for example, $\epsilon r$=2.5 or 3.5, is inserted, there is no large change in the dispersion curve, and the influence upon the transmission characteristic is small. However, a comparison between the model (FIG. 36) in which no board is inserted and the model (FIG. 38) in which a board is inserted shows that the insertion of the board causes the cutoff frequency to decrease. However, as described above, the amount of the decrease of the cutoff frequency may be compensated for by setting the y dimension.

It can be seen from the results of FIGS. 34 to 46 that a practical transmission line whose transmission loss is 20 dB/m or less can be formed through the use of low dielectric constant $\epsilon r$=2.5 to 3.5, the board thickness t=0.1 to 0.3 mm, and the dielectric tangent $\tan\delta=2\times10^{-3}$ (corresponds to thereof the board of a fluororesin type) of the circuit board.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A nonradiative dielectric line apparatus which is an integrated circuit having nonradiative dielectric lines positioned in parallel to each other in which a dielectric strip is provided between two conductors, wherein a circuit board having a conductor film or a circuit element together with a conductor film provided thereon is disposed between said two conductors and substantially in parallel to the conductors, and the conductor film or the circuit element provided on said circuit board is brought close to or is made to penetrate into said dielectric strip in order to couple said conductor film or said circuit element to said nonradiative dielectric line.

2. A nonradiative dielectric line apparatus according to claim 1, wherein an oscillation element, and a conductor line for transmitting oscillation signals of the oscillation element are provided on said circuit board, and the conductor line is brought close to or is made to penetrate into said dielectric strip in order to transmit said oscillation signals to said nonradiative dielectric line.

3. A nonradiative dielectric line apparatus according to claim 1, wherein a resistor film is formed on said circuit board, and the resistor film is brought close to or is made to penetrate into said dielectric strip in order to attenuate the electromagnetic wave propagated through said nonradiative dielectric line.

4. A nonradiative dielectric line apparatus according to claim 1, wherein two of said dielectric strips are provided side by side to form two nonradiative dielectric lines, a plurality of conductor film patterns are provided on said circuit board at intervals of ¼ of a waveguide length, the plurality of conductor film patterns provided between said two dielectric strips, and the plurality of conductor film patterns are brought close to or are made to penetrate into said two dielectric strips in order to couple said two nonradiative dielectric lines to each other.

5. An instrument for measuring characteristics of a circuit board, said instrument comprising:

two conductors positioned in parallel to each other, a dielectric strip provided between the two conductors, and a circuit board housing section for housing a circuit board having a conductor film or a circuit element together with a conductor film provided thereon is disposed between said two conductors and substantially in parallel to the conductors, wherein the conductor film or the circuit element provided on said circuit board is brought close to or is made to penetrate into said dielectric strip in order to couple said conductor film or said circuit element to said nonradiative dielectric line;

said circuit board housing section being disposed between said two conductors, wherein the characteristics of said circuit board are measured via said dielectric strip with the circuit board being housed in the circuit board housing section.

* * * * *